United States Patent
Ansari et al.

(10) Patent No.: US 11,522,640 B2
(45) Date of Patent: *Dec. 6, 2022

(54) HIGH SPEED INTERCONNECT SYMBOL STREAM FORWARD ERROR-CORRECTION

(71) Applicant: INTEL CORPORATION, Santa Clara, CA (US)

(72) Inventors: Nausheen Ansari, Folsom, CA (US); Ziv Kabiry, Haifa (IL); Gal Yedidia, Haifa (IL)

(73) Assignee: INTEL CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/353,000

(22) Filed: Jun. 21, 2021

(65) Prior Publication Data

US 2021/0314086 A1 Oct. 7, 2021

Related U.S. Application Data

(63) Continuation of application No. 16/524,613, filed on Jul. 29, 2019, now Pat. No. 11,044,045, which is a continuation of application No. 15/089,251, filed on Apr. 1, 2016, now Pat. No. 10,367,605.

(60) Provisional application No. 62/188,109, filed on Jul. 2, 2015.

(51) Int. Cl.
*H04L 1/00* (2006.01)
*H03M 13/15* (2006.01)
*H03M 13/29* (2006.01)
*H03M 13/00* (2006.01)
*H03M 5/14* (2006.01)
*H03M 13/31* (2006.01)

(52) U.S. Cl.
CPC .......... *H04L 1/0057* (2013.01); *H03M 5/145* (2013.01); *H03M 13/1515* (2013.01); *H03M 13/2906* (2013.01); *H03M 13/31* (2013.01); *H04L 1/0041* (2013.01)

(58) Field of Classification Search
CPC .... H04L 1/0057; H04L 1/0041; H03M 5/145; H03M 13/1515; H03M 13/2906; H03M 13/31
See application file for complete search history.

(56) References Cited

U.S. PATENT DOCUMENTS 7,024,616 B2 * 4/2006 Ohira .................... H04L 1/0083
714/772
7,694,204 B2 * 4/2010 Schmidt ................ H04L 1/0061
714/799

FOREIGN PATENT DOCUMENTS

TW       I474658 B    2/2015

* cited by examiner

*Primary Examiner* — Justin R Knapp
(74) *Attorney, Agent, or Firm* — KDB Firm PLLC

(57) ABSTRACT

Disclosed herein are techniques to provide forward error correction for a high-speed interconnect symbol stream, such as, DisplayPort. The symbol stream may be split into FEC blocks and parity bits generated for each of the FEC blocks. The parity bits may be interleaved, encoded, and transmitted over an interconnect along with the symbol stream to provide forward error correction for the symbol stream.

38 Claims, 16 Drawing Sheets

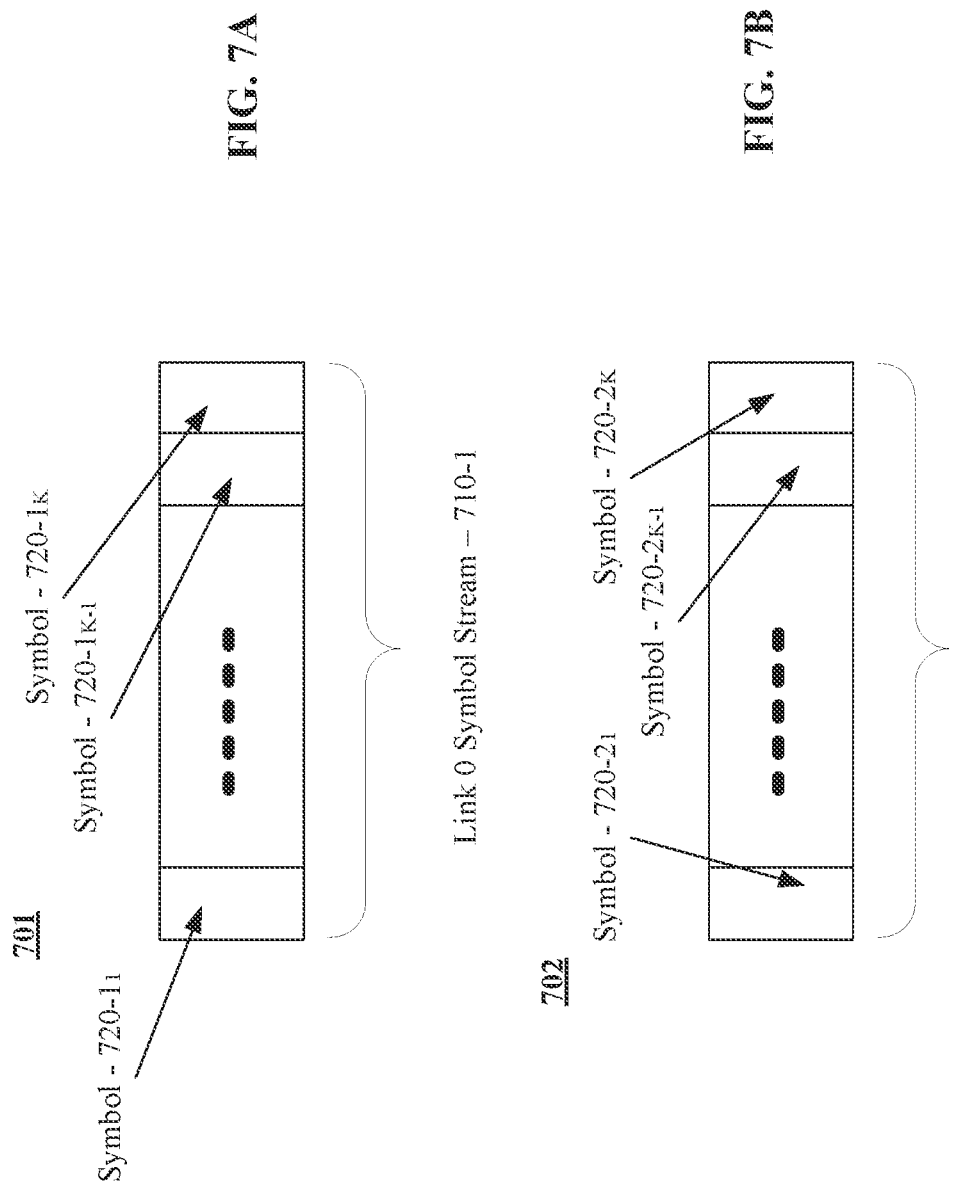

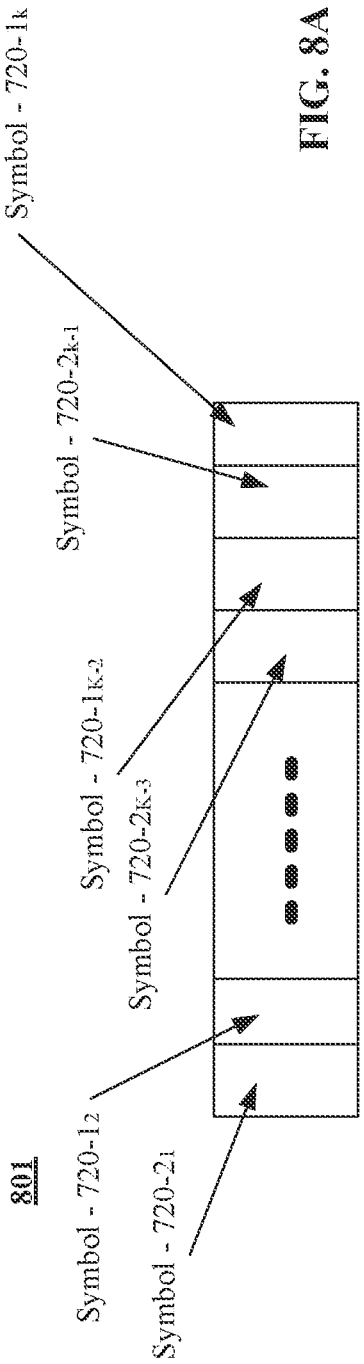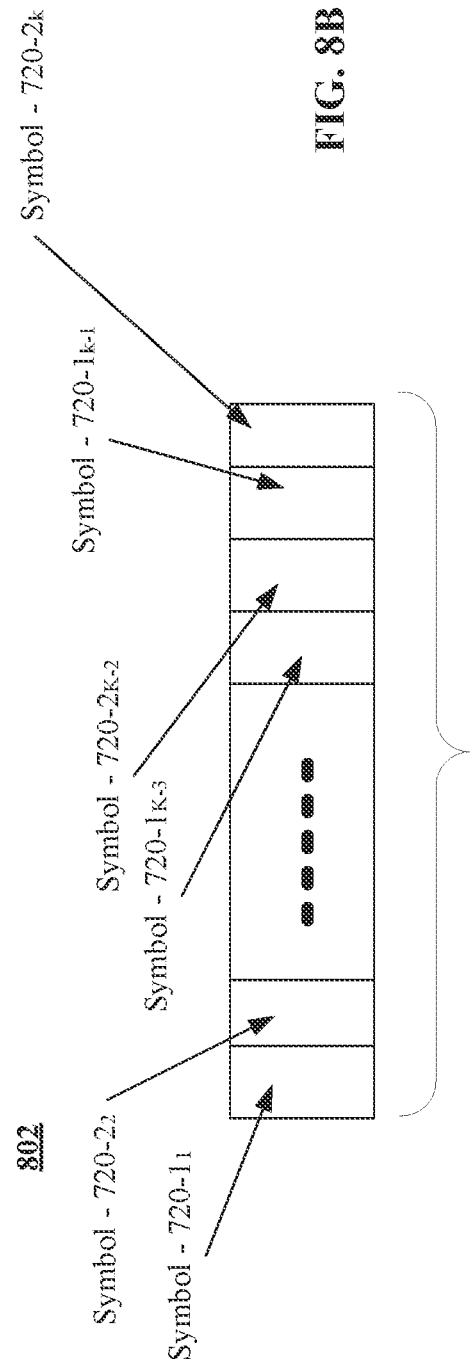

Parity Bits – 750-1 | Symbol Stream – 710-1

Link 0 Symbol Stream with Error Correction
760-1

Parity Bits – 750-2 | Symbol Stream – 710-2

Link 1 Symbol Stream with Error Correction
760-2

HIGH SPEED INTERCONNECT SYMBOL STREAM FORWARD ERROR-CORRECTION

CROSS REFERENCE TO RELATED APPLICATION

This application is a continuation of, claims the benefit of and priority to previously filed U.S. patent application Ser. No. 16/524,613 filed Jul. 29, 2019, entitled "HIGH SPEED INTERCONNECT SYMBOL STREAM FORWARD ERROR-CORRECTION", which is a continuation of, claims the benefit of and priority to previously filed U.S. patent application Ser. No. 15/089,251 filed Apr. 1, 2016, issued on Jul. 30, 2019 as U.S. Pat. No. 10,367,605, which claims the benefit of U.S. Provisional Application Ser. No. 62/188,109 filed Jul. 2, 2015, entitled "FORWARD ERROR-CORRECTION FOR DISPLAYPORT SYMBOL STREAM," which are hereby incorporated by reference in their entireties.

BACKGROUND

Serial interconnects provide means for conveying streams of bits from one component to another. With modern computing devices, high-speed serial interconnects are often used to communicatively couple various components together. For example, a computing device may be coupled to a number of peripheral devices (e.g., display, Ethernet hub, auxiliary storage device, or the like) via one or more high-speed interconnects. Examples of such interconnects are DisplayPort, Thunderbolt, USB, etc.

In general, high-speed serial interconnects provide for conveying information from one component to the other. The information is first coded into digital words ("symbols") with a fixed size ("frames") in the transmitter side and then sent, as a serial bit stream, to the receiver side via the interconnect medium. The receiver receives the serial bit stream, synchronizes each frame, and decodes the symbols. Some high-speed serial interconnects do not compress data. For example, modern DisplayPort standards provide adequate bandwidth to support up to 5K display resolutions without compressing the symbol stream. Accordingly, random bit errors may result in corruption of a few pixels per frame, which may be acceptable for particular implementations. However, for compressed symbol streams, random bit errors may result in corruption of the entire frame, which may be unacceptable for particular implementations.

BRIEF DESCRIPTION OF THE DRAWINGS

FIGS. 7A-7B illustrate eight and ninth example information elements.
FIGS. 8A-8B illustrate tenth and eleventh example information elements.
FIGS. 11A-11B illustrate sixteenth and seventeenth example information elements.

DETAILED DESCRIPTION

Various embodiments may be generally directed to forward error correction (FEC) techniques for serial interconnects and particularly to applying error correction to fully formed symbol streams for modern high-speed serial interconnects, such as, for example DisplayPort. In particular, the present disclosure may be implemented to provide FEC techniques for already formed symbol streams. With some examples, the present disclosure may be implemented as part of a DisplayPort interconnect. In particular, the present disclosure may be implemented in accordance with one or more standards promulgated by the Video Electronics Standards Association (VESA), such as, The DisplayPort Standard v 1.3, published September 2014 or the DisplayPort Standard v 1.4, which is yet to be published. It is important to note, that the present disclosure, although conveniently referencing DisplayPort for the various examples, may be applied to other high-speed serial interconnect. Examples are not limited in this context.

DisplayPort symbol streams include 10-bit symbols (e.g., generated using 8B10B encoding). It is to be appreciated, that 8B10B encoding tracks the running disparity to maintain DC-balance. DisplayPort symbol streams may be implemented as single, dual or quad lane configurations. The present disclosure provides techniques to add redundancy to the symbol stream to enable detection and correction of bit errors. In some examples, a Reed-Solomon (RS) encoding scheme is applied to the symbol stream to provide FEC. In general, the DisplayPort symbol stream is split into FEC blocks with k symbols of m bits. A block code may be generated based on RS encoding over a Galois Fields (GF) algorithm. For example, the block code may be generated based on RS (n, k) over GF ($2^m$) where the block size is n m-bit symbols. Additionally, n–k parity bytes may be generated which enables correction of (n–k)/2 symbols.

Additionally, with some examples, the FEC blocks may be symbol interleaved to increase burst error correction. For example, for a single lane DisplayPort interface, parity symbols for two FEC blocks may interleaved, split into bytes, and encoded using 8B10B encoding. As such, the two FEC blocks and the parity symbols for these two FEC blocks may be sent over the interface.

Figure 1:
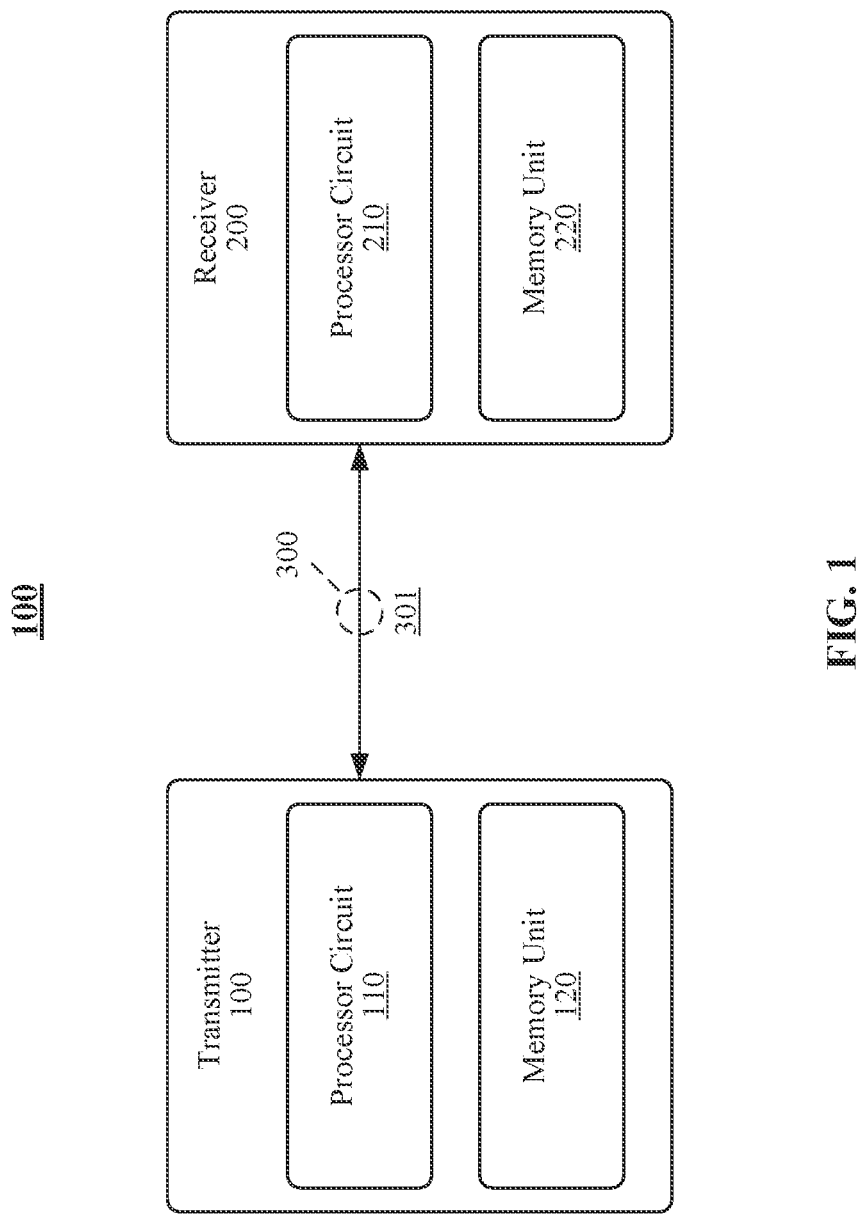
FIG. 1 illustrates an example system.

FIG. 1 illustrates a block diagram of a system 100 to apply FEC to a fully formed high-speed interconnect symbol stream. In particular, the system 100 may be configured to apply FEC techniques to a fully formed DisplayPort symbol stream. As depicted, the system 100 includes a transmitter 100 and a receiver 200, communicatively coupled by an interconnect 300. It is important to note, although the interconnect 300 is depicted as wired, it may, in some examples, be wireless. In some examples, the interconnect 300 may be a high-speed serial interconnect, such as, for example, DisplayPort. It is important to note, the system is depicted including a "transmitter" and a "receiver." However, in some examples, the transmitter 100 may both transmit and receive data and the receiver 200 may both receive and transmit data. Furthermore, with some examples, the system 100 may be implemented as a single device (e.g., possibly in the same housing, or the like) while in other examples; multiple devices may implement the system.

In general, the processor component 110 may receive and/or generate information element 600 to include indications of a high-speed interconnect symbol stream including FEC error-correction information 301. For example, the processor component 110 can encode information (e.g., data, display data, or the like) according to one or more of the standards referenced above (e.g., a DisplayPort standard). Additionally, the processor component 110 may generate information elements to include indications of FEC parity bits corresponding to the symbol stream. The processor component 110 may cause (e.g., by sending a control signal, or the like) the information element 301 including both the payload (e.g., symbol stream) and the FEC error-correction information to be transmitted to the receiver 200 via the interconnect 300. The processor component 210, may decode the high-speed interconnect symbol stream from the information element 301 to recover the data (e.g., to display, or the like) and additionally, may decode the FEC parity bits to detect and correct any bit errors in the transmitted symbol stream.

This is described in greater detail below, for example, with respect to the technique of FIG. 12, and associated information elements. It is noted, that the balance of the disclosure uses an example symbol stream according to a DisplayPort standard. In particular, DisplayPort symbol streams are used in the following examples for purposes of clarity of presentation only. It is worthy to note, the various examples described herein can be implemented to provide error-correction for other high-speed interconnects than the DisplayPort interconnect. Examples are not limited in this context.

As further shown in FIG. 1, the transmitter may include a processor circuit 110 and a memory unit 120 while the receiver may include a processor circuit 210 and a memory unit 220.

The processor circuit 110 and/or 210 may be implemented using any processor or logic device, such as a complex instruction set computer (CISC) microprocessor, a reduced instruction set computing (RISC) microprocessor, a very long instruction word (VLIW) microprocessor, an x86 instruction set compatible processor, a processor implementing a combination of instruction sets, a multi-core processor such as a dual-core processor or dual-core mobile processor, or any other microprocessor or central processing unit (CPU). Processor circuit 110 and/or 210 may also be implemented as a dedicated processor, such as a controller, a microcontroller, an embedded processor, a chip multiprocessor (CMP), a co-processor, a digital signal processor (DSP), a network processor, a media processor, an input/output (I/O) processor, a media access control (MAC) processor, a radio baseband processor, an application specific integrated circuit (ASIC), a field programmable gate array (FPGA), a programmable logic device (PLD), and so forth. In one embodiment, for example, processor circuit 110 and/or 210 may be implemented as a general purpose processor, such as a processor made by Intel® Corporation, Santa Clara, Calif. The examples are not limited in this context.

In various embodiments, the processor circuit 110 and/or processor circuit 210 may comprise or be arranged to communicatively couple with memory unit 120 and/or 220, respectably. The memory units 120 and/or 220 may be implemented using any machine-readable or computer-readable media capable of storing data, including both volatile and non-volatile memory. For example, memory unit 120 and/or 220 may include read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, or any other type of media suitable for storing information.

It is worthy of note that some portion or all of memory units 120 and/or 220 may be included on the same integrated circuit as processor circuits 110 and/or 210, respectably. Alternatively, some portion or all of memory units 120 and/or 220 may be disposed on an integrated circuit or other medium, for example a hard disk drive, that is external to the integrated circuit of processor circuits 110 and/or 210. Although the memory units 120 and 220 are comprised within or as part of apparatus 100 and/or 200, the memory units 120 and/or 220 may be external to the respective apparatuses 100 and 200. The examples are not limited in this context.

Figure 2:
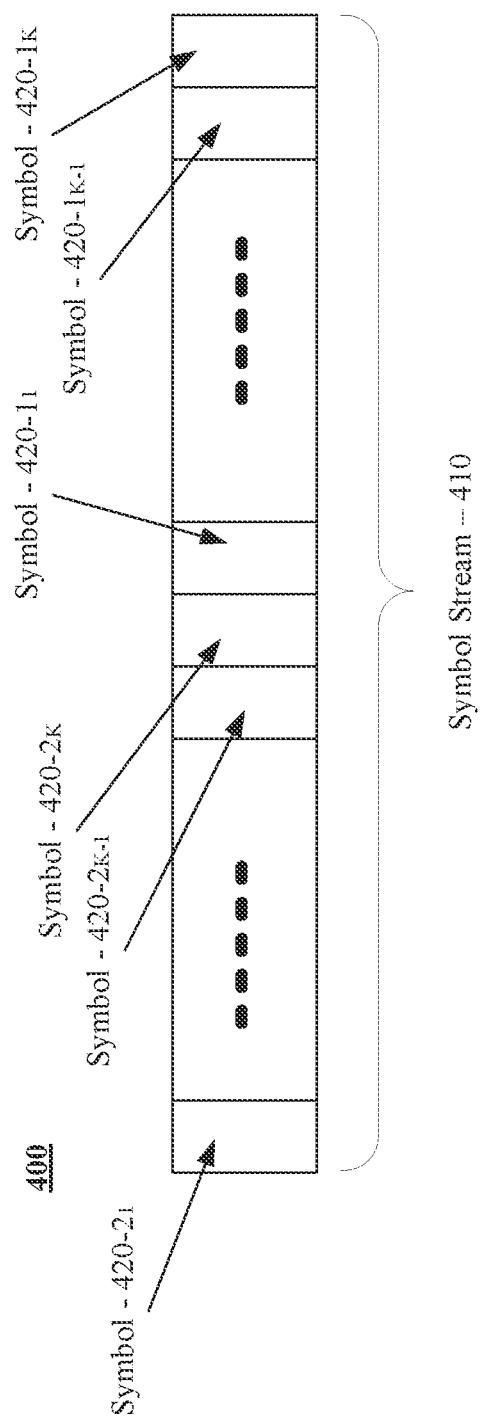
FIG. 2 illustrates a first example information element.
Figure 3A:
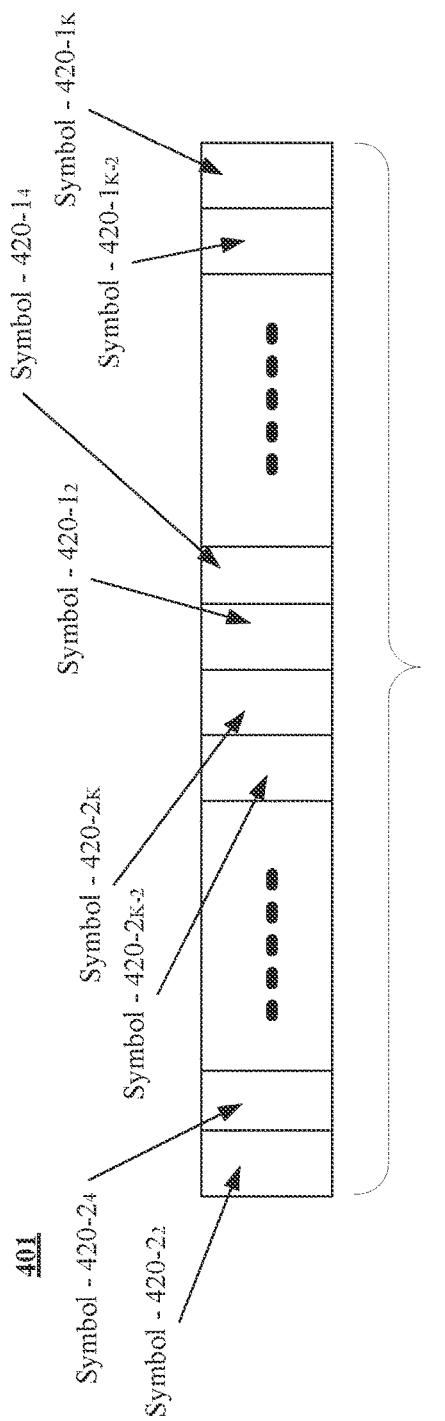
FIGS. 3A-3B illustrate second and third example information elements.
Figure 3B:
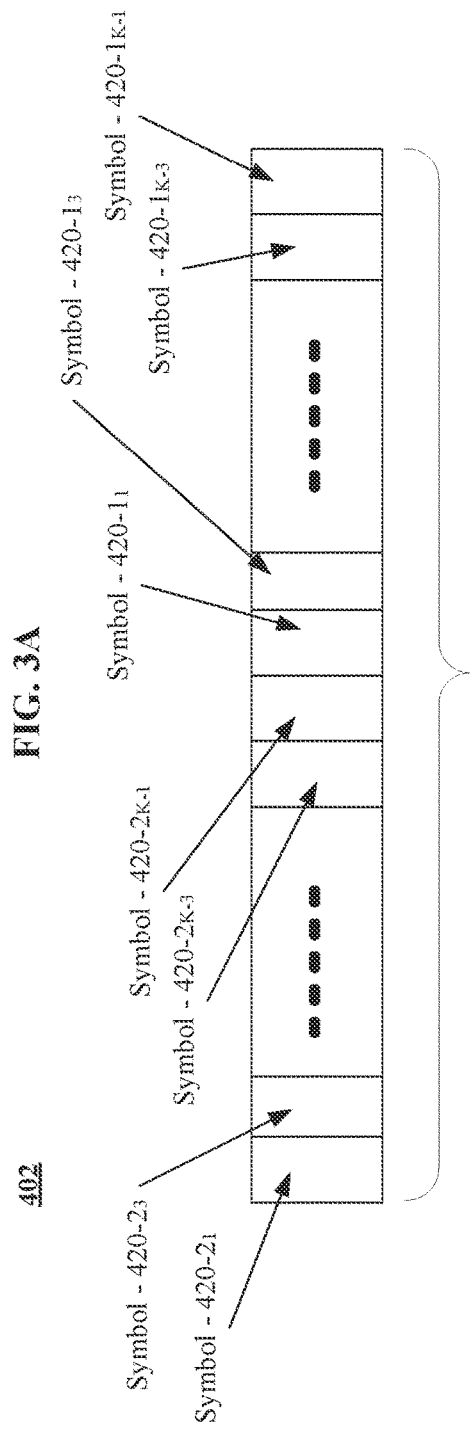
Figure 4A:
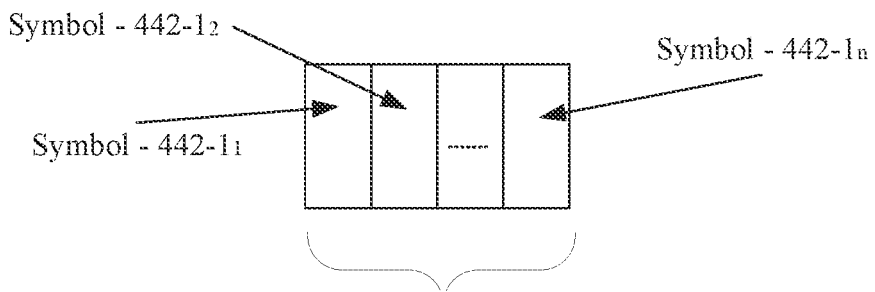
FIGS. 4A-4B illustrate fourth and fifth example information elements.
Figure 4B:
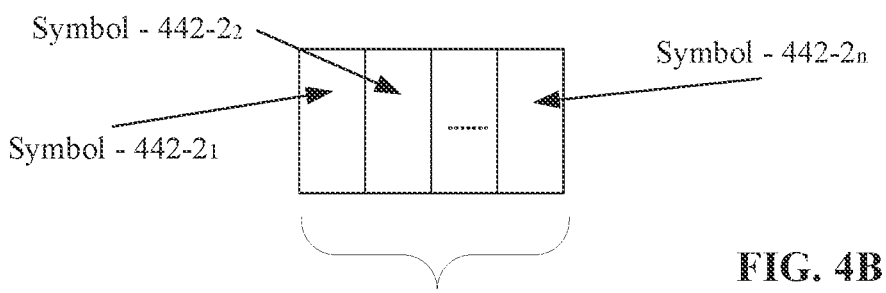
Figure 5:
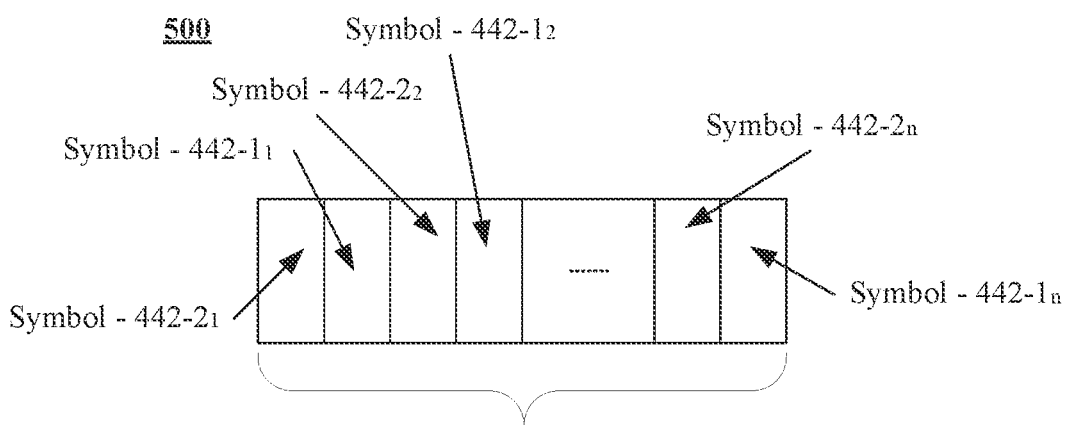
FIG. 5 illustrate a sixth example information element.
Figure 6:
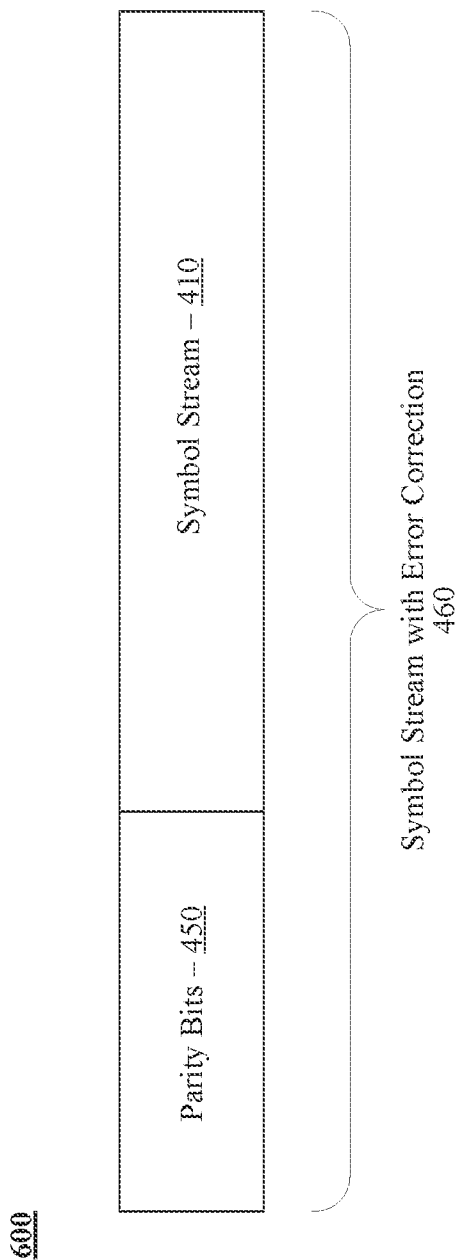
FIG. 6 illustrate a seventh example information element.

FIGS. 2, 3A-3B, 4A-4B, and 5-6 illustrate a DisplayPort symbol stream and FEC scheme that may be implemented to provide FEC for the DisplayPort symbol stream. In particular, these figures illustrate information elements that may be transmitted over the interconnect 300 to provide FEC for a DisplayPort symbol stream, such as, a fully formed (e.g., encoded encrypted, scrambled, or the like) DisplayPort symbol stream. For example, the transmitter 100 and receiver 200 may communicate, via the interconnect 300 (e.g., by receiving, encoding, decoding, generating, interleaving, etc.), the symbols and bits indicated within the information elements depicted in these figures. In general, FIG. 2 depicts an information element 400 including an indication of a DisplayPort symbol stream 410; FIGS. 3A-3B depict information elements 401 and 402, respectively, which each including indications of portions of the DisplayPort symbol stream 410; FIGS. 4A-4B depict information element 403 and 404, respectively, which each include indications of parity symbols 440-$a$ (where "a" is a positive integer) corresponding to one of the portions (e.g., depicted in FIGS. 3A-3B) of the DisplayPort symbol stream 410; FIG. 5 depicts an information element 500 including indications of the parity symbols 440-$a$ interleaved and encoded as a DisplayPort symbols; and FIG. 6 depicts an information element 600 including indications of the display port symbol stream 410 and the interleaved and encoded parity symbols.

It is to be appreciated, that in some examples, the symbols may be contiguously located in the information elements. Furthermore, it is important to note, that these figures depict implementing FEC for a symbol stream transmitted over a single lane or single link DisplayPort interface. However, examples are not limited in these contexts.

Turning more specifically to FIG. 2, the information element 400 is illustrated. The information element 400 may correspond to a fully formed DisplayPort symbol stream 410. For example, the information element may include indications of multiple groups of k-8b10b encoded symbols. With some examples, the symbols may be encrypted and/or scrambled to protect the transmission. It is to be appreciated, that the DisplayPort symbol stream 410 may include any number of k-symbols (e.g., 8b10b encoded line link (LL) symbols). However, for purposes of illustration and clarity, the symbol stream 410 is depicted including 2 k symbols. In particular, the symbol stream 410 may include symbols 420-bk, where "b" and "k" are positive integers. For example, this figure depicts the symbol stream 420 including parity symbols 420-11 to 420-1k and 420-21 to 420-2k.

With some examples, the transmitter 100 may receive the symbol stream 410. In some examples, the transmitter 100 may generate the symbol stream 410. Turning more specifically to FIGS. 3A-3B, the transmitter 100 may split the symbol stream into FEC blocks 430-b, where "b" is a positive integer. In particular, the transmitter 100 may split the symbol stream into FEC blocks of k symbols. In some examples, the transmitter may split the symbol stream into even and odd symbols. Said differently, the transmitter may interleave the symbols from the k sets of symbols in the symbol stream 410 to form FEC blocks 430-b. FIG. 3A illustrates the information element 401 to include indication of a FEC block 430-1. The FEC block 430-1 may include the even symbols from the symbol stream 410. In particular, the FEC block 430-1 may include the symbols 420-bk, where "k" is a positive, even integer. Similarly, FIG. 3B illustrates the information element 402 to include indication of a FEC block 430-2. The FEC block 430-2 may include the odd symbols from the symbol stream 410. In particular, the FEC block 430-2 may include the symbols 420-bk, where "k" is a positive, odd integer.

Turning more specifically to FIGS. 4A-4B, the transmitter 100 may generate parity symbols 440-c for each of the FEC blocks 430-b, where "c" is a positive integer. In particular, the transmitter 100 may encode FEC symbols based on one or more forward error correction scheme. In general, the transmitter 100 may generate FEC symbols based on an RS error-correction schemes, a Hamming error-correction scheme, or the like. As depicted, FIG. 4A illustrates the information element 403 to include indications of FEC parity symbols 440-1. The FEC parity symbols 440-1 may be generated from the FEC block 430-1. In some examples, the FEC parity symbols 440-1 may be generated from an RS (n, k) error-correction code from the k symbols in the FEC block 430-1. Accordingly, the FEC parity symbols 440-1 may include individual parity symbols 442-11 to 442-1n, where "n" is a positive integer corresponding to the RS (n, k) error-correction scheme for the k symbols in the FEC block 430-1. Similarly, FIG. 4B illustrates the information element 404 to include indications of FEC parity symbols 440-2. The FEC parity symbols 440-2 may be generated from the FEC block 430-2. In some examples, the FEC parity symbols 440-2 may be generated from an RS (n, k) error-correction code from the k symbols in the FEC block 430-2. Accordingly, the FEC parity symbols 440-1 may include individual parity symbols 442-21 to 442-2n, where "n" is a positive integer corresponding to the RS (n, k) error-correction scheme for the k symbols in the FEC block 430-2.

Turning more specifically to FIG. 5, the transmitter 100 may interleave and/or encode the parity symbols for each of the FEC blocks 440-c. As depicted, the information element 500 may include indications of parity bits corresponding to the parity symbols 442-cn, interleaved to form a set of parity bits 450 for the DisplayPort symbol stream 410. It is noted, that the transmitter 100 can interleave the parity symbols 442-cn to form the set of parity bits 450 to increase the burst error correction rate. With some examples, the FEC parity symbols 440-cn are converted to bytes and encoded (e.g., based on 8b10b encoding, or the like) for transmission over the interface 300.

Turning more specifically to FIG. 6, the transmitter 100 may form the information element 600 to include an indication of the DisplayPort symbol stream 410 and the FEC error-correction parity bits 450. Accordingly, the transmitter 100 may send and/or transmit the information element 600, including the DisplayPort symbol stream 410 and the FEC error-correction parity bits 450, over the interface 300 to provide error detection and correction for the symbol stream. In some examples, the information element 600 may correspond to the information element 301 depicted in FIG. 1.

FIGS. 7A-7B, 8A-8B, 9A-9B, 10A-10B, and 11A-11B illustrate a symbol stream and FEC scheme that may be implemented to provide FEC for a dual-link symbol stream. In particular, these figures illustrate information elements that may be transmitted over the interconnect 300 to provide FEC for a dual-link symbol stream, such as, a fully formed (e.g., encoded encrypted, scrambled, or the like) multiple link DisplayPort symbol stream. For example, the transmitter 100 and receiver 200 may communicate, via the interconnect 300 (e.g., by receiving, encoding, decoding, generating, interleaving, etc.), the symbols and bits indicated within the information elements depicted in these figures. It is worthy to note, as used herein, dual-link is intended to imply a high-speed interconnect (or interface) to transmit multiple signals and can correspond to various dual-mode or dual-link display streams. For example, dual-link, as used herein, can be a dual-mode DisplayPort, or DisplayPort++.

Figure 9A:
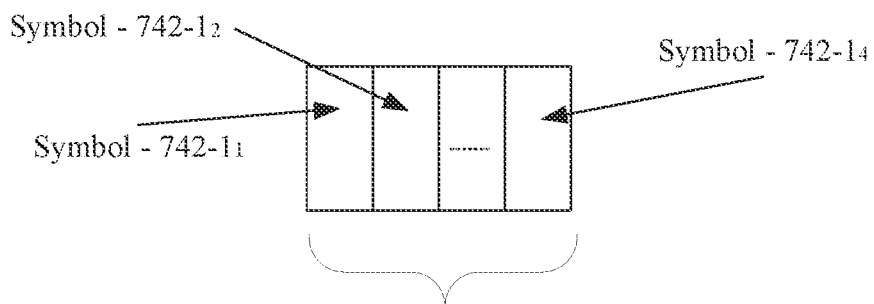
FIGS. 9A-9B illustrate twelfth and thirteenth example information elements.
Figure 9B:
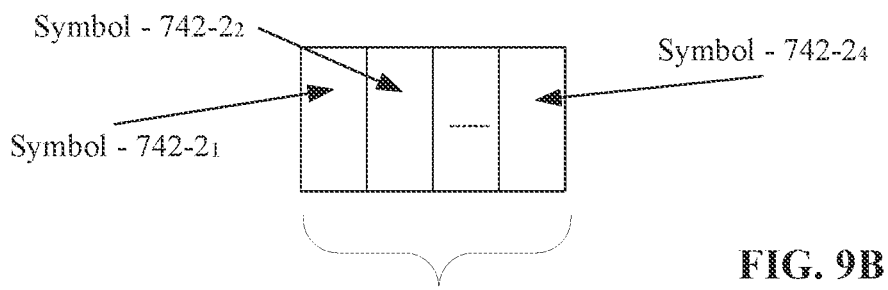
Figure 10A:
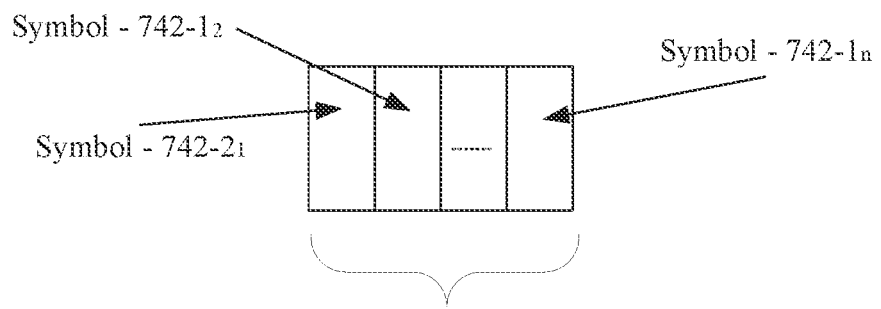
FIGS. 10A-10B illustrate fourteenth and fifteenth example information elements.
Figure 10B:
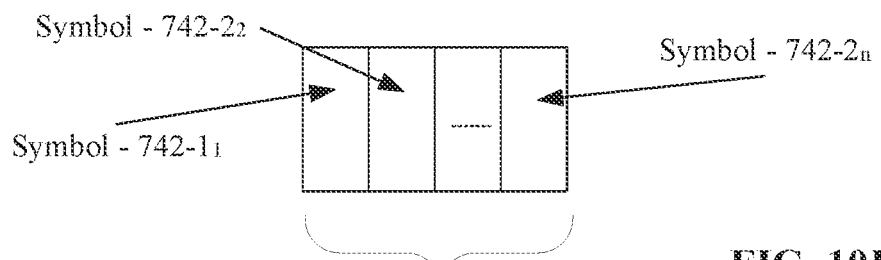

In general, FIGS. 7A-7B depict information elements 701 and 702, respectively, including an indication of DisplayPort symbol streams 710-1 and 710-2 corresponding to a dual link interconnect; FIGS. 8A-8B depict information elements 801 and 802, respectively, which each include indications of portions (e.g., depicted in FIGS. 7A-7B) of the DisplayPort symbol streams 710-1 and 710-2; FIGS. 9A-9B depict information element 901 and 902, respectively, which each include indications of parity symbols 740-a corresponding to one of the portions of the DisplayPort symbol streams 710-1 and 710-2; FIGS. 10A-10B depict information elements 1001 and 1002, respectively, including indications of the parity symbols 740-a interleaved and encoded as a DisplayPort symbols; and FIGS. 11A-11B depicts information element 1101 and 1102, respectively, including indications of the display port symbol streams 710-1 and 710-2 and the interleaved and encoded parity symbols.

It is to be appreciated, that in some examples, the symbols may be contiguously located in the information elements. Furthermore, it is important to note, that these figures depict implementing FEC for a DisplayPort symbol stream transmitted over a dual lane or dual link DisplayPort interface. However, examples are not limited in these contexts.

Turning more specifically to FIGS. 7A-7B, the information elements 701 and 702 are illustrated. The information elements 701 and 702 may correspond to a fully formed DisplayPort symbol stream for a dual link DisplayPort interconnect. In particular, the symbol streams 710-1 and 710-2 are depicted. For example, the information elements may each include indications of one or more groups of k-8b10b encoded symbols. With some examples, the symbols may be encrypted and/or scrambled to protect the transmission. It is to be appreciated, that the DisplayPort symbol streams 710-1 and 710-2 may include any number of k-symbols (e.g., 8b10b encoded line link (LL) symbols). However, for purposes of illustration and clarity, each of the symbol streams 710-1 and 710-2 are depicted including k symbols. In particular, the symbol stream 710-1 may include symbols 720-1$k$, while the symbol stream 710-2 may include symbols 720-2$k$.

With some examples, the transmitter 100 may receive the symbol streams 710-1 and 710-2. In some examples, the transmitter 100 may generate the symbol streams 710-1 and 710-2. Turning more specifically to FIGS. 8A-8B, the transmitter 100 may split the symbol streams into FEC blocks 730-$b$, where "b" is a positive integer. In particular, the transmitter 100 may split the symbol stream into FEC blocks of k symbols. In some examples, the transmitter may interleave the symbols from the symbol streams 710-1 and 710-2 to form FEC blocks 730-$b$. As depicted, FIG. 8A illustrates the information element 801 to include indication of a FEC block 730-1. The FEC block 730-1 may include a portion of the symbols from the symbol streams 710-1 and 710-2. Similarly, FIG. 8B illustrates the information element 802 to include indication of a FEC block 730-2. In some examples, the FEC block 730-2 may the other portion of symbols from the symbol streams 710-1 and 710-2.

Turning more specifically to FIGS. 9A-9B, the transmitter 100 may generate parity symbols 740-$c$ for each of the FEC blocks 730-$b$, where "c" is a positive integer. In particular, the transmitter 100 may encode FEC symbols based on one or more forward error correction schemes. In general, the transmitter 100 may generate FEC symbols based on an RS error-correction schemes, a Hamming error-correction scheme, or the like. As depicted, FIG. 9A illustrates the information element 901 to include indication of a FEC parity symbols 740-1. The FEC parity symbols 740-1 may be generated from the FEC block 730-1. In some examples, the FEC parity symbols may be generated from an RS (n, k) error-correction code from the k symbols in the FEC block 730-1. Accordingly, the FEC parity symbols 740-1 may include individual parity symbols 742-11 to 742-1$n$, where "n" is a positive integer corresponding to the RS (n, k) error-correction scheme for the k symbols in the FEC block 730-1. Similarly, FIG. 9B illustrates the information element 902 to include indication of a FEC parity symbols 740-2. The FEC parity symbols 740-2 may be generated from the FEC block 730-2. In some examples, the FEC parity symbols may be generated from an RS (n, k) error-correction code from the k symbols in the FEC block 730-2. Accordingly, the FEC parity symbols 440-1 may include individual parity symbols 742-21 to 742-2$n$, where "n" is a positive integer corresponding to the RS (n, k) error-correction scheme for the k symbols in the FEC block 730-2.

Turning more specifically to FIGS. 10A-10B, the transmitter 100 may interleave and/or encoded the parity symbols from each of the FEC blocks 740-$c$ to form parity bits 750-$c$. As depicted, the information elements 1001 and 1002 may each include indications of the parity bits corresponding to ones of the parity symbols 742-$cn$, interleaved to form a set of parity bits for the DisplayPort symbol streams 710-1 and 710-2. It is noted, that the parity symbols may be interleaved as described to increase the burst error correction rate. With some examples, the FEC parity symbols 740-$cn$ are converted to bytes and encoded (e.g., based on 8b10b encoding, or the like) for transmission over the interface 300.

Turning more specifically to FIGS. 11A-11B, the transmitter 100 may form the information elements 1101 and 1102 to include symbols streams with error correct 760-1 and 760-2, respectively. In particular, the information elements 1101 and 1102 include indications of the DisplayPort symbol streams 710-1 and 710-2 and the FEC error-correction parity bits 750-1 and 750-1. Accordingly, the transmitter 100 may send and/or transmit the DisplayPort symbol stream 710-1 and 710-2 over the interface 300 along with FEC error-correction parity bits 750-1 and 750-2 to provide error detection and correction for the symbol stream for a dual link DisplayPort configuration.

Figure 12:
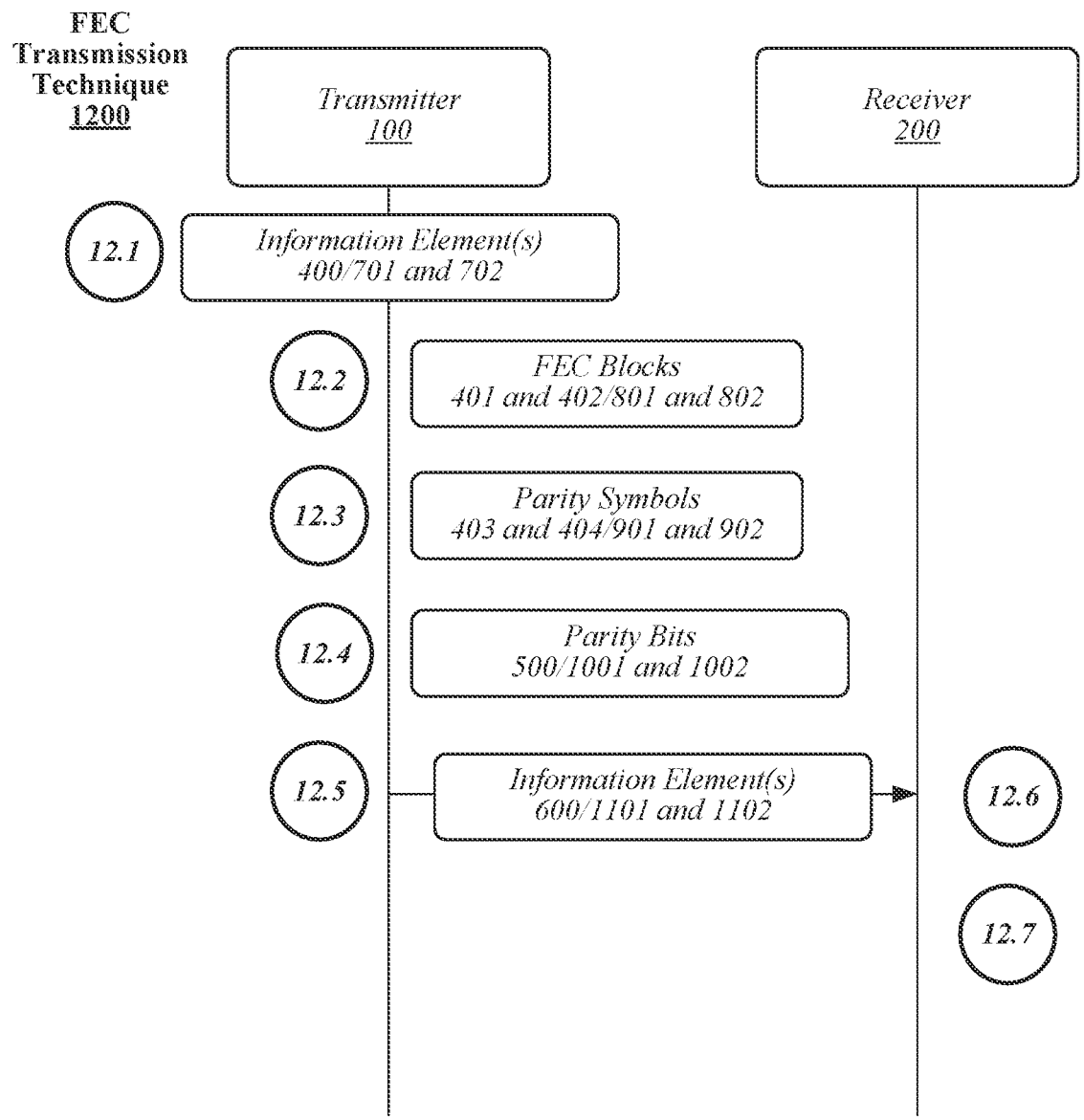
FIG. 12 illustrates an example technique.

FIG. 12 illustrates a flow diagram for a FEC transmission technique 1200, arranged according to the present disclosure. The technique 1200 may be implemented by the system 100, to provide FEC for a DisplayPort symbol stream communicated via the interconnect 300. In particular, the transmitter 100 and the receiver 200 may implement the technique 1200. The technique 1200 may begin at circle 12.1. At circle 12.1, the transmitter 100 may receive and/or generate the information element including indications of a high-speed interconnect symbol stream. For example, the transmitter 100 can generate the information element 400 including the symbol stream 410. As another example, the transmitter 100 can generate the information elements 701 and 702 including the symbol streams 710-1 and 710-2, respectively.

Continuing to circle 12.2, the transmitter 100 can split the symbol stream (or streams) into FEC blocks. More specifically, the transmitter 100 can interleave the symbols from the symbol stream(s) into FEC blocks. For example, the transmitter 100 can interleave the symbols 420-$bk$ to form FEC blocks 430-$b$, where each FEC block 430-$b$ includes ones of the symbols 420-$bk$. As another example, the transmitter 100 can interleave symbols 720-1$k$ and 720-2$k$ to form FEC blocks 730-1 and 730-2, where each FEC block includes ones of the symbols 720-1$k$ and 720-2$k$.

Continuing to circle 12.3, the transmitter 100 may generate FEC parity symbols from the FEC blocks. In particular, the transmitter 100 can generate a set of parity symbols for each of the FEC blocks. For example, the transmitter 100 can generate parity symbols 440-1 (e.g., including symbols 442-1$n$) for FEC block 430-1 and parity symbols 440-2 (e.g., including symbols 442-2$n$) for FEC block 430-2. As another example, the transmitter 100 can generate parity symbols 740-1 (e.g., including symbols 742-1$n$) for FEC block 730-1 and parity symbols 740-2 (e.g., including symbols 742-2$n$) for FEC block 730-2.

Continuing to circle 12.4, the transmitter 100 may generate FEC parity bits from the FEC parity symbols. More specifically, the transmitter 100 can convert symbols to bytes, encode symbols, or the like to generate FEC parity bits based on the parity symbols. For example, the transmitter 100 can generate parity bits 450 (e.g., via converting, encoding, and/or the like) based on the symbols 442-$bn$ of the parity symbols 440-1 and 440-2. As another example, the transmitter 100 can generate parity bits 750-1 and 750-1 (e.g., via converting, encoding, and/or the like) based on the symbols 742-1$n$ and 742-2$n$ of the parity symbols 740-1 and 740-2.

Continuing to circle 12.5, the transmitter 100 may generate information element(s) to include indications of the symbol stream(s) and the FEC parity bits. For example, the transmitter 100 can generate information element 600 including indications of the parity bits 450 and the symbol stream 410. As another example, the transmitter 100 can generate information elements 1101 and 1102 including indications of parity bits 750-1/symbol stream 710-1 and parity bits 750-2/symbol stream 710-2. Furthermore, at circle 12.5, the transmitter 100 can send the generated information elements (e.g., 600, 1101 and 1102, or the like) to receiver 200 via the interconnect 300 to provide FEC for a DisplayPort symbol stream.

Continuing to block 12.6, the receiver 200 may receive the information elements(s) to include indication of the DisplayPort symbol stream(s) and the FEC parity bits. More specifically, the receiver 200 can, at circle 12.6, receive the information element(s) transmitted by the transmitter 100 at circle 12.5. For example, the receiver can receive, via the interconnect, information element 600 or information elements 1101 and 1102.

Continuing to block 12.7, the receiver may decode the symbol stream(s) and detect errors and/or correct errors in the symbol stream(s) using the FEC parity bits. More specifically, the receiver 200 can decode the symbols based on the parity bits to correct errors in the transmission. For example, the receiver 200 can decode and/or correct the symbols 420-$bk$ based on parity bits 450. As another example, the receiver 200 can decode and/or correct the symbols 720-$1k$ based on parity bits 750-1 and symbols 720-$2k$ based on parity bits 750-2.

Figure 13:
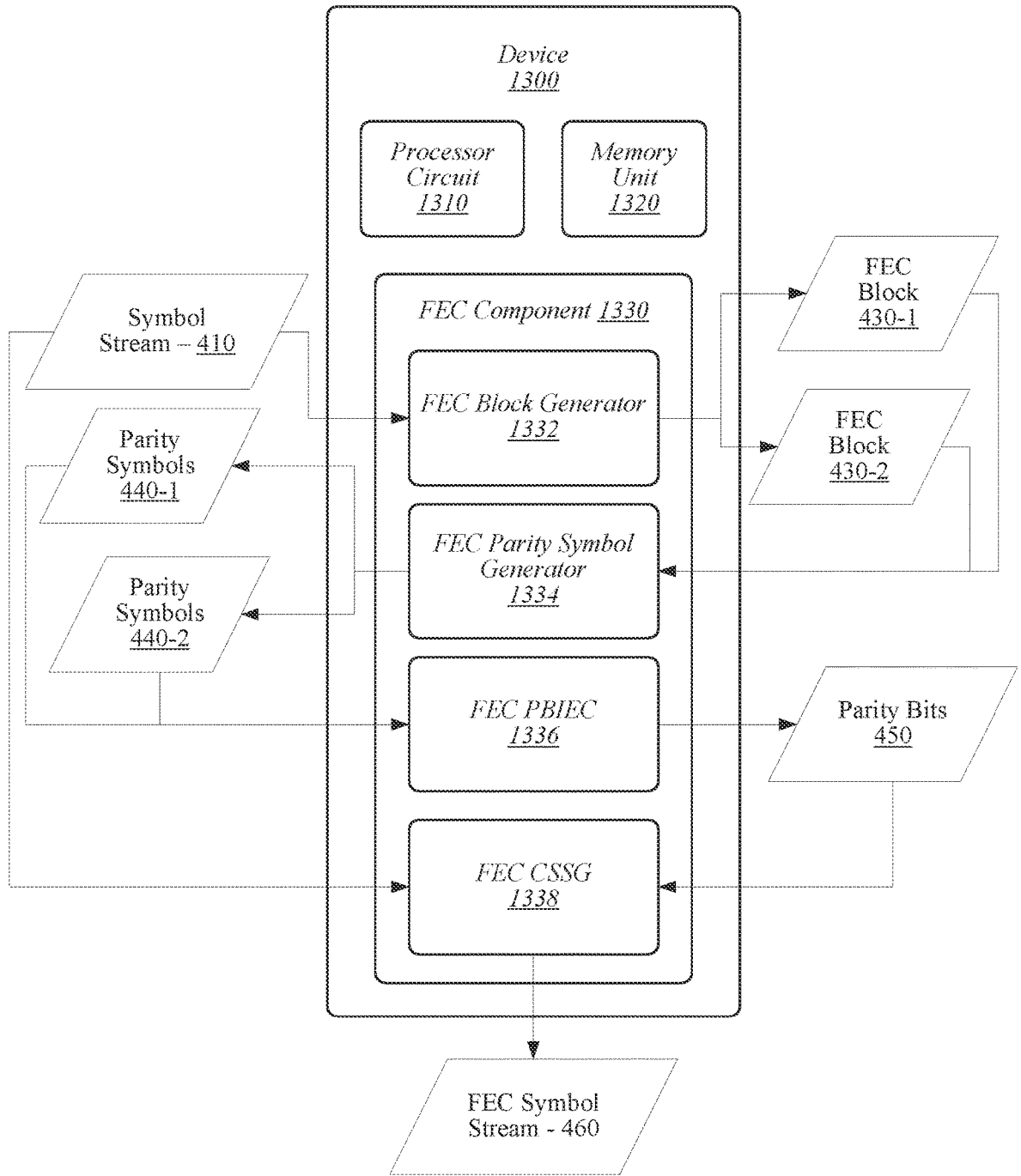
FIG. 13 illustrates a first example device.

FIG. 13 illustrates a block diagram of a device 1300. In general, the device 1300 may be configured to communicate via a high-speed serial interconnect using the FEC technique (e.g., the technique 1200) of the present disclosure. In some examples, the device 1300 may be implemented by the transmitter 100. The device may include a processor circuit 1310 (e.g., the processor circuit 110, or the like) and a memory unit 1320 (e.g., the memory unit 120 or the like). Additionally, the device 1300 may include a FEC component 1330. The FEC component 1330 may be implemented as logic and/or features of the processor circuit and/or as instructions stored in the memory unit and executable by the processor circuit.

The FEC component 1330 may include an FEC block generator 1332, a FEC parity symbol generator 1334, a FEC parity byte interleaving and encoding (PBIE) component 1336, and a FEC correctable symbol stream generator (CSSG) 1338.

The FEC block generator 1332 may comprise logic, circuitry, and/or instructions (e.g., instructions capable of being executed by the processor circuit 1310) to cause the device 1300 to generate and/or receive the symbol stream 410 and to generate FEC blocks 430-1 and 430-2 from the symbol stream 410.

The FEC parity symbol generator 1334 may comprise logic, circuitry, and/or instructions (e.g., instructions capable of being executed by the processor circuit 1310) to cause the device 1300 to generate parity symbols 440-1 and 440-2 from the FEC blocks 430-1 and 430-1. With some examples, the FEC parity symbol generator 1334 may include multiple generators or may provide that each of the parity symbols 440-1 and 440-2 may be generated simultaneously from FEC blocks 430-1 and 430-2. In particular, multiple FEC generators 1334 can be used to perform FEC on the interleaved symbols. For example, one encoder may process the even symbols while the other encoder processes the odd symbols. As such, the incoming symbols may be streamed out onto the link while they are also converted to the FEC symbols and fed into the appropriate FEC encoder, thus eliminating the need for storing and buffering the symbols from the symbol stream.

The FEC PBIEC 1336 may comprise logic, circuitry, and/or instructions (e.g., instructions capable of being executed by the processor circuit 1310) to cause the device 1300 to generate the parity bits 450. In particular, the FEC PBIEC 1336 may convert the parity symbols to bytes and may encode them based on 8b10b encoding to form parity bits 450.

The FEC CSSG 1338 may comprise logic, circuitry, and/or instructions (e.g., instructions capable of being executed by the processor circuit 1310) to cause the device 1300 to generate the information element 600 to include a FEC correctable symbol streams (e.g., the symbol stream 410 and the parity bits 450, or the like).

Figure 14:
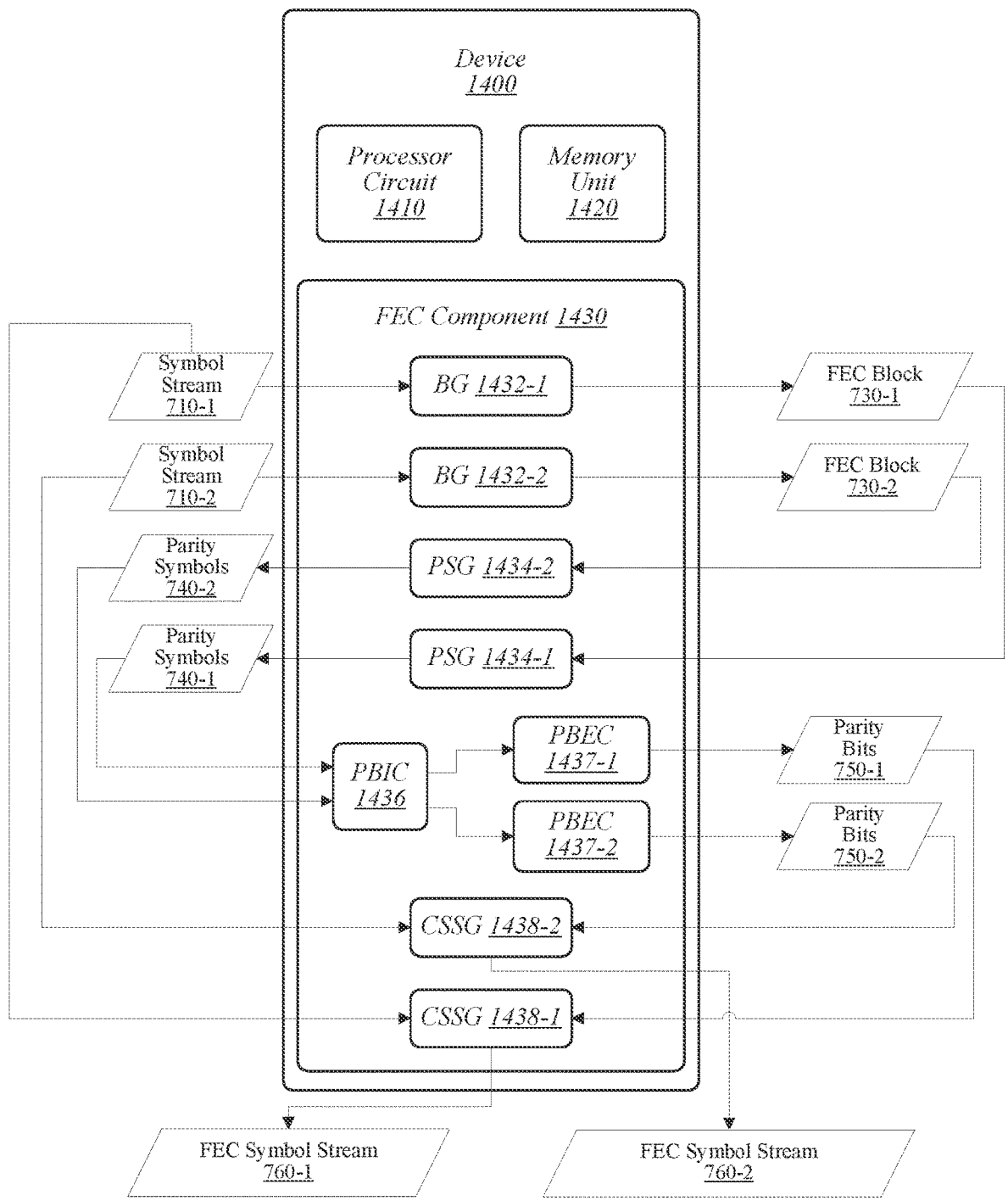
FIG. 14 illustrates a second example device.

FIG. 14 illustrates a block diagram of a device 1400. In general, the device 1400 may be configured to communicate via a high-speed serial interconnect using the FEC technique (e.g., the technique 1200) of the present disclosure. In some examples, the device 1400 may be implemented by the transmitter 100. The device may include a processor circuit 1410 (e.g., the processor circuit 110, or the like) and a memory unit 1420 (e.g., the memory unit 120 or the like). Additionally, the device 1300 may include a FEC component 1430. The FEC component 1430 may be implemented as logic and/or features of the processor circuit and/or as instructions stored in the memory unit and executable by the processor circuit.

The FEC component 1430 may include FEC block generators (BGs) 1443-1 and 1443-2, FEC parity symbol generators (PSGs) 1434-1 and 1434-2, a FEC parity byte interleaving component (PBIC) 1436, FEC parity byte encoding components (PBEC) 1437-1 and 1437-2, and FEC correctable symbol stream generators (CSSG) 1438-1 and 1438-2.

The FEC block generators 1432-1 and 1432-2 may comprise logic, circuitry, and/or instructions (e.g., instructions capable of being executed by the processor circuit 1410) to cause the device 1400 to generate and/or receive the symbol streams 710-1 and 710-2 and to generate FEC blocks 730-1 and 730-2 from the symbol streams.

The FEC parity symbol generators 1434-1 and 1434-2 may comprise logic, circuitry, and/or instructions (e.g., instructions capable of being executed by the processor circuit 1410) to cause the device 1400 to generate parity symbols 740-1 and 740-2 from the FEC blocks 730-1 and 730-1.

The FEC PBIC 1336 may comprise logic, circuitry, and/or instructions (e.g., instructions capable of being executed by the processor circuit 1410) to cause the device 1400 to interleave the FEC symbols as described with respect to FIGS. 10A-10B. In particular, the FEC PBIC 1336 may interleave the parity symbols and pass the interleaved symbols to the FEC PBEC 1437-1 and 1437-2 for encoding. The FEC PBEC 1437-1 and 1437-2 may convert the interleaved parity symbols to bytes and may encode them based on 8b10b encoding to form parity bits 750-1 and 750-2.

The FEC CSSG 1438-1 and 1438-2 may comprise logic, circuitry, and/or instructions (e.g., instructions capable of being executed by the processor circuit 1410) to cause the device 1400 to generate the information elements 1101 and 1102 to include FEC correctable symbol streams 760-1 and 760-2 (e.g., symbol streams 710-1 and 710-2 and the parity bits 750-1 and 750-2, or the like).

Figure 15:
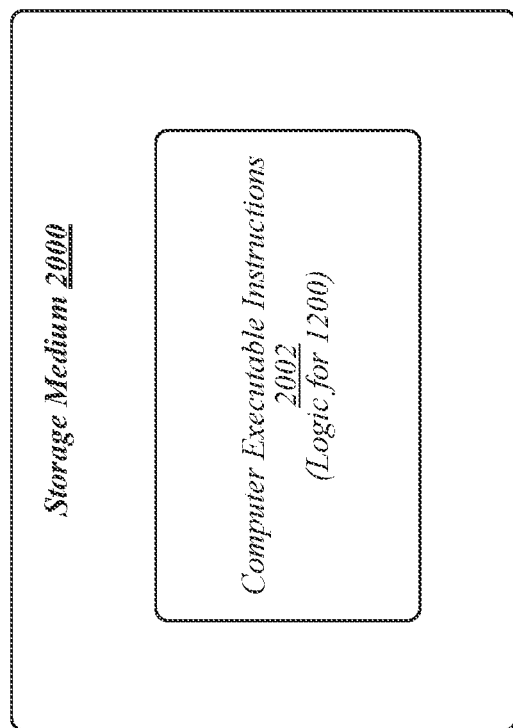
FIG. 15 illustrates an example computer readable medium.

FIG. 15 illustrates an embodiment of a storage medium 2000. The storage medium 2000 may comprise an article of manufacture. In some examples, the storage medium 2000 may include any non-transitory computer readable medium or machine readable medium, such as an optical, magnetic or semiconductor storage. The storage medium 2000 may store various types of computer executable instructions e.g., 2002). For example, the storage medium 2000 may store various types of computer executable instructions to implement technique 1200

Figure 16:
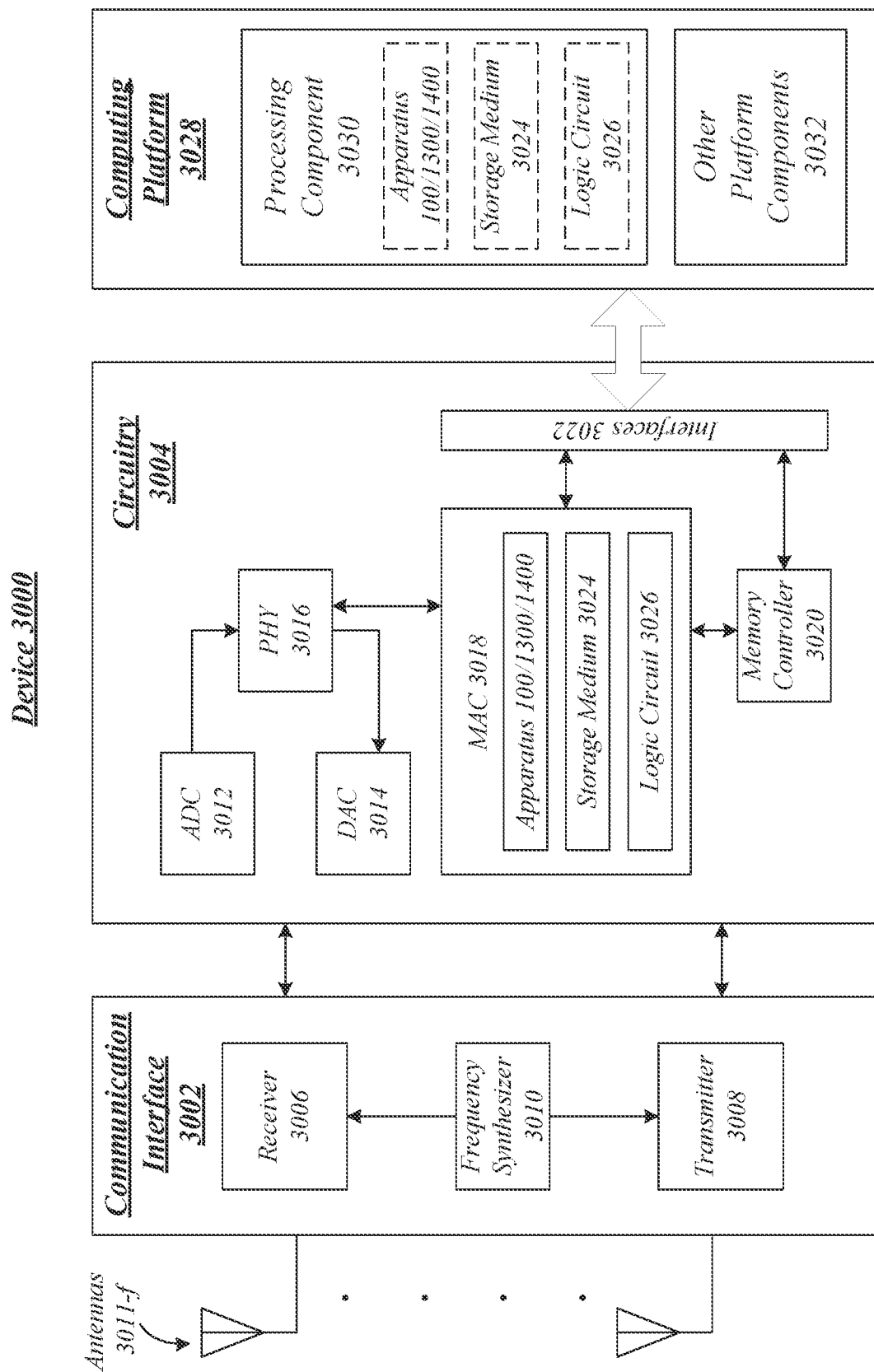
FIG. 16 illustrates a third example device.

Examples of a computer readable or machine readable storage medium may include any tangible media capable of storing electronic data, including volatile memory or non-volatile memory, removable or non-removable memory, erasable or non-erasable memory, writeable or rewriteable memory, and so forth. Examples of computer executable instructions may include any suitable type of code, such as source code, compiled code, interpreted code, executable code, static code, dynamic code, object-oriented code, visual code, and the like. The examples are not limited in this context FIG. 16 illustrates an embodiment of a device 3000 that may implement one or more of apparatus 100 or 200 of FIG. 1, or any portion thereof, or of devices 1300 or 1400 of FIGS. 13-14, or any portion thereof. As shown in this figure, the device 3000 can include a storage medium 3024. The storage medium 3024 may comprise any non-transitory computer-readable storage medium or machine-readable storage medium, such as an optical, magnetic or semiconductor storage medium. In various embodiments, the storage medium 3024 may comprise an article of manufacture. In some embodiments, the storage medium 3024 may store computer-executable instructions, such as computer-executable instructions to implement one or more of the operations described in relation to the transmitter 100, the receiver 200, the device 1300, the device 1400, and/or the storage medium 2000. Examples of a computer-readable storage medium or machine-readable storage medium may include any tangible media capable of storing electronic data, including volatile memory or non-volatile memory, removable or non-removable memory, erasable or non-erasable memory, writeable or re-writeable memory, and so forth. Examples of computer-executable instructions may include any suitable type of code, such as source code, compiled code, interpreted code, executable code, static code, dynamic code, object-oriented code, visual code, and the like. The embodiments are not limited in this context.

In various embodiments, device 3000 may comprise a logic circuit 3026. The logic circuit 3026 may include physical circuits to perform operations described for the transmitter 100, the receiver 200, the device 1300 and/or the device 1400. In some examples, the logic circuit 3026 may implement logic to perform the technique 1200. As shown in this figure, device 3000 may include a communication interface 3002, circuitry 3004, and computing platform 3028, although the embodiments are not limited to this configuration.

The device 3000 may implement some or all of the structure and/or operations for one or more of apparatus 100, 200, 1300, and/or 1400, storage medium 3024, and/or logic circuit 3026 in a single computing entity, such as entirely within a single device. Alternatively, the device 3000 may distribute portions of the structure and/or operations for one or more of apparatus 100, 200, 1300 and/or 1400, storage medium 3024, and/or logic circuit 3026 across multiple computing entities using a distributed system architecture, such as a client-server architecture, a 3-tier architecture, an N-tier architecture, a tightly-coupled or clustered architecture, a peer-to-peer architecture, a master-slave architecture, a shared database architecture, and other types of distributed systems. The embodiments are not limited in this context.

In various embodiments, communication interface 3002 may include a component or combination of components adapted for transmitting and receiving communication messages over one or more wired or wireless interfaces according to one or more communication standard protocols, such as wireless mobile broadband technologies. For example, various embodiments may involve transmission and/or reception by communication interface 3002 over one or more wireless connections according to one or more 3rd Generation Partnership Project (3GPP), 3GPP Long Term Evolution (LTE), and/or 3GPP LTE-Advanced (LTE-A) technologies and/or standards, including their revisions, progeny and variants. Various embodiments may additionally or alternatively involve transmissions according to one or more Global System for Mobile Communications (GSM)/Enhanced Data Rates for GSM Evolution (EDGE), Universal Mobile Telecommunications System (UMTS)/High Speed Packet Access (HSPA), and/or GSM with General Packet Radio Service (GPRS) system (GSM/GPRS) technologies and/or standards, including their revisions, progeny and variants.

Examples of wireless mobile broadband technologies and/or standards may also include, without limitation, any of the Institute of Electrical and Electronics Engineers (IEEE) 802.16 wireless broadband standards such as IEEE 802.16m and/or 802.16p, International Mobile Telecommunications Advanced (IMT-ADV), Worldwide Interoperability for Microwave Access (WiMAX) and/or WiMAX II, Code Division Multiple Access (CDMA) 2000 (e.g., CDMA2000 1×RTT, CDMA2000 EV-DO, CDMA EV-DV, and so forth), High Performance Radio Metropolitan Area Network (HIPERMAN), Wireless Broadband (Wire), High Speed Downlink Packet Access (HSDPA), High Speed Orthogonal Frequency-Division Multiplexing (OFDM) Packet Access (HSOPA), High-Speed Uplink Packet Access (HSUPA) technologies and/or standards, including their revisions, progeny and variants.

Some embodiments may additionally or alternatively involve wireless communications according to other wireless communications technologies and/or standards. Examples of other wireless communications technologies and/or standards that may be used in various embodiments may include, without limitation, other IEEE wireless communication standards such as the IEEE 802.11, IEEE 802.11a, IEEE 802.11b, IEEE 802.11g, IEEE 802.11n, IEEE 802.11u, IEEE 802.11ac, IEEE 802.11ad, IEEE 802.11af, and/or IEEE 802.11ah standards, High-Efficiency Wi-Fi standards developed by the IEEE 802.11 High Efficiency WLAN (HEW) Study Group, Wi-Fi Alliance (WFA) wireless communication standards such as Wi-Fi, Wi-Fi Direct, Wi-Fi Direct Services, Wireless Gigabit (WiGig), WiGig Display Extension (WDE), WiGig Bus Extension (WBE), WiGig Serial Extension (WSE) standards and/or standards developed by the WFA Neighbor Awareness Networking (NAN) Task Group, machine-type communications (MTC) standards such as those embodied in 3GPP Technical Report (TR) 23.887, 3GPP Technical Specification (TS) 22.368, and/or 3GPP TS 23.682, and/or near-field communication (NFC) standards such as standards developed by the NFC Forum, including any revisions, progeny, and/or variants of any of the above. The embodiments are not limited to these examples.

In addition to transmission and/or reception over one or more wireless connections, various embodiments may involve transmission and/or reception by communication interface 3002 over one or more wired connections through one or more wired communications media. Examples of wired communications media may include a wire, cable, metal leads, printed circuit board (PCB), backplane, switch fabric, semiconductor material, twisted-pair wire, co-axial cable, fiber optics, and so forth. The embodiments are not limited in this context.

As an example, the communications interface 3002 may be a radio interface (e.g., an RF radio interface) having one or more RF transceivers. As an RF interface, the communications interface 3002 may include a component or combination of components adapted for transmitting and/or receiving single-carrier or multi-carrier modulated signals (e.g., including complementary code keying (CCK), orthogonal frequency division multiplexing (OFDM), and/or single-carrier frequency division multiple access (SC-FDMA) symbols) although the embodiments are not limited to any specific over-the-air interface or modulation scheme. The communications interface 3002 may include, for example, a receiver 3006 and a transmitter 3008. The receiver 3006 and transmitter 3008 can together be considered a transceiver and can be adapted for communications over a wireless and/or wired communications interface as described above. As a radio interface, the communications interface 3002 may also include a frequency synthesizer 3010. As a radio interface, the communications interface 3002 may include bias controls, a crystal oscillator and/or one or more antennas 3011-*f*. In another embodiment as a radio interface, the communications interface 3002 may use external voltage-controlled oscillators (VCOs), surface acoustic wave filters, intermediate frequency (IF) filters and/or RF filters, as desired. Due to the variety of potential RF interface designs an expansive description thereof is omitted.

Circuitry 3004 may communicate with communications interface 3002 to process, receive and/or transmit signals. The circuitry 3004 may include an analog-to-digital converter (ADC) 3012 and a digital-to-analog converter (DAC) 3014. In some embodiments for the communications interface 3002 implemented as a radio interface, the ADC 3012 can be used for down converting received signals and the DAC 3014 can be used for up converting signals for transmission. The circuitry 3004 may include a baseband or physical layer (PHY) processing circuit 3016 for PHY link layer processing of respective receive/transmit signals. The circuitry 3004 may include, for example, a medium access control (MAC) processing circuit 3018 for MAC/data link layer processing. The circuitry 3004 may include a memory controller 3020 for communicating with MAC processing circuit 3018 and/or a computing platform 3028, for example, via one or more interfaces 3022.

In some embodiments, PHY processing circuit 3016 may include a frame construction and/or detection module, in combination with additional circuitry such as a buffer memory, to construct and/or deconstruct communication frames. Alternatively, or in addition, MAC processing circuit 3018 may share processing for certain of these functions or perform these processes independent of PHY processing circuit 3016. In some embodiments, MAC and PHY processing may be integrated into a single circuit.

The computing platform 3028 may provide computing functionality for the device 3000. As shown, the computing platform 3028 may include a processing component 3030. In addition to, or alternatively of the circuitry 3004, the device 3000 may execute processing operations or logic for one or more of apparatus 100, 200, and/or 800, storage medium 3024, logic circuit 3026 using the processing component 3030.

The processing component 3030 (and/or PHY 3016 and/or MAC 3018) may comprise various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation.

The computing platform 3028 may further include other platform components 3032. Other platform components 3032 include common computing elements, such as one or more processors, multi-core processors, co-processors, memory units, chipsets, controllers, peripherals, interfaces, oscillators, timing devices, video cards, audio cards, multimedia input/output (I/O) components (e.g., digital displays), power supplies, and so forth. Examples of memory units may include without limitation various types of computer readable and machine readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory, solid state drives (SSD) and any other type of storage media suitable for storing information.

Device 3000 may be, for example, an ultra-mobile device, a mobile device, a fixed device, a machine-to-machine (M2M) device, a personal digital assistant (PDA), a mobile computing device, a smart phone, a telephone, a digital telephone, a cellular telephone, digital camera or camcorder, user equipment, eBook readers, a handset, a one-way pager, a two-way pager, a messaging device, a computer, a personal computer (PC), a desktop computer, a laptop computer, a notebook computer, a netbook computer, a handheld computer, a tablet computer, a server, a server array or server farm, a web server, a network server, an Internet server, a work station, a mini-computer, a main frame computer, a supercomputer, a network appliance, a web appliance, a distributed computing system, multiprocessor systems, processor-based systems, consumer electronics, programmable consumer electronics, game devices, display, television, digital television, set top box, wireless access point, base station, node B, eNB, PDN-GW, TWAG, eDPG, subscriber station, mobile subscriber center, radio network controller, router, hub, gateway, bridge, switch, machine, or combination thereof. Accordingly, functions and/or specific configurations of device 3000 described herein, may be included or omitted in various embodiments of device 3000, as suitably desired.

Embodiments of device 3000 may be implemented using single input single output (SISO) architectures. However, certain implementations may include multiple antennas (e.g., antennas 3011-f) for transmission and/or reception using adaptive antenna techniques for beamforming or spatial division multiple access (SDMA) and/or using MIMO communication techniques.

The components and features of device 3000 may be implemented using any combination of discrete circuitry, application specific integrated circuits (ASICs), logic gates and/or single chip architectures. Further, the features of device 3000 may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It should be appreciated that the exemplary device 3000 shown in the block diagram of FIG. 8 may represent one functionally descriptive example of many potential implementations. Accordingly, division, omission or inclusion of block functions depicted in the accompanying figures does not infer that the hardware components, circuits, software and/or elements for implementing these functions would be necessarily be divided, omitted, or included in embodiments.

Figure 17:
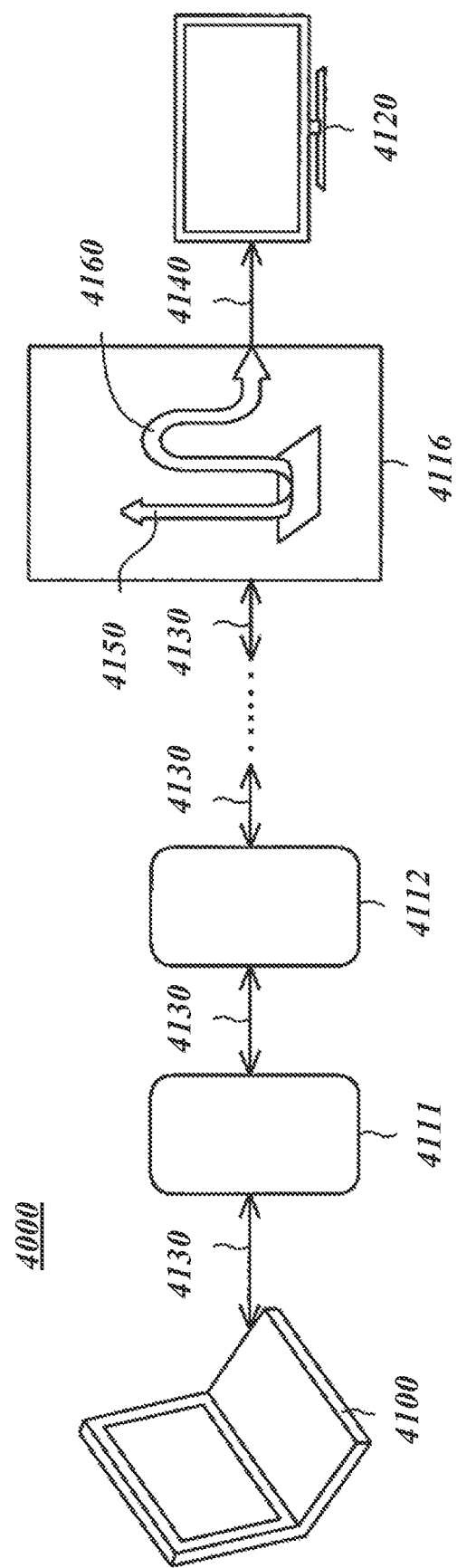
FIG. 17 illustrates a fourth example device.

FIG. 17 illustrates an example system 4000 including a computing device 4100. The system may be an exemplary implementation of the system 100. Additionally, the computing device 4100 may be an exemplary implementation of the device 100, the device 200, the device 1300, and/or the device 4100. As an example, the computing device 4100 can be a mobile telephone, a smart phone, a tablet, a notebook computer, a netbook, or an ultra-mobile computer, or other handheld device. The computing device 4100 is depicted operably and/or communicatively coupled to peripheral devices 4111-4116 and display 4120 via interconnects 4130.

The peripheral devices 4111-4116 may be any of a variety of computing devices, such as, for example, a data storage device, a media access device (e.g., CD drive, or the like), an interconnect hub, a network interface card, or the like. The computing device 4100 may operably connect to the peripheral devices 4111-4116 via the interconnect 4130. In particular, the computing device 4100 may be configured to communicate (e.g., transmit data streams, audio streams, and/or video streams, or the like) with the peripheral devices via the interconnect 4130 as described above. For example, the computing device may implement the technique 1200 described in relation to FIG. 12.

Example of the display 4120 may include a television, a monitor, a projector, and a computer screen. In one embodiment, for example, display 4004 may be implemented by a liquid crystal display (LCD), light emitting diode (LED) or other type of suitable visual interface. Display 4120 may comprise, for example, a touch-sensitive display screen ("touchscreen"). In some implementations, display 4120 may comprise one or more thin-film transistors (TFT) LCD including embedded transistors. The display may be operably coupled to one of the peripheral devices via an interconnect 4140. In some examples, the interconnects 4130 and 4140 may be different (e.g., Thunderbolt and DisplayPort.) In some examples, interconnects 4130 and 4140 may be the same. The embodiments, however, are not limited to these examples.

In some examples, one or more of the peripheral devices may be configured to receive a data stream as describe herein and also transmit a data stream as described herein. Additionally, the peripheral may be configured to receive the data stream via a first interconnect and transmit the data stream via a second interconnect. For example, the peripheral 4116 is depicted communicating with the computing device 4100 via the interconnect 4130 and communicating with the display 4120 via the interconnect 4140. This may be facilitated by, for example, utilizing a lane 4150 of interconnect 4130 (e.g., the PCI-E lane, or the like) for a portion of the bit stream (e.g., data) and another lane 4160 of interconnect 4140 (e.g., the DisplayPort lane, or the like) for another portion of the bit stream (e.g., display data).

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor. Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The follow examples pertain to additional examples of technologies disclosed herein.

Example 1. An apparatus, comprising: a processor circuit; and a forward-error correction (FEC) component executable by the processor circuit, the FEC component to: receive a high-speed interconnect symbol stream having a plurality of symbols; determine FEC parity bits based in part on the plurality of symbols of the symbol stream; generate a FEC correctable symbol stream based on the plurality of symbols and the FEC parity bits.

Example 2. The apparatus of example 1, wherein the high-speed interconnect is a DisplayPort interconnect.

Example 3. The apparatus of example 2, the FEC component to: generate a first FEC block and a second FEC block from the plurality of symbols of the symbol stream, the first FEC block comprising a first subset of the plurality of symbols and the second FEC block comprising a second subset, different than the first subset, of the plurality of symbols; and determine the FEC parity bits based in part on the FEC blocks.

Example 4. The apparatus of example 3, the FEC component to: determine a first number of parity symbols based in part on the symbols of the first FEC block and to determine a second number of symbols based in part on the symbols of the second FEC block; and determine the FEC parity bits based in part on the first number of parity symbols and the second number of parity symbols.

Example 5. The apparatus of example 4, the FEC component to encode the first number of parity symbols and the second number of parity symbols to determine the FEC parity bits.

Example 6. The apparatus of example 5, the FEC component to generate an information element to include indication of the plurality of symbols of the symbol stream and the FEC parity bits.

Example 7. The apparatus of example 6, the FEC component to interleave the first number of parity symbols and the second number of parity symbols to determine the FEC parity bits.

Example 8. The apparatus of example 6, comprising an interconnect component to send the information element to a receiver view the high-speed interconnect.

Example 9. The apparatus of example 3, the DisplayPort interconnect a dual-link interconnect, the high-speed interconnect symbol stream a first high-speed interconnect symbol stream corresponding to a first link of the dual-link interconnect, the FEC component to: receive a second high-speed interconnect symbol stream corresponding to a second link of the dual-link interconnect; and generate the first FEC block and the second FEC block from the plurality of symbols of the first symbol stream and the second symbol stream, the first FEC block comprising a first subset of the plurality of symbols of the first symbol stream and the second symbol stream and the second FEC block comprising a second subset, different than the first subset, of the plurality of symbols of the first symbol stream and the second symbol stream.

Example 10. The apparatus of any one of examples 4 to 9, the FEC component to generate the first number of parity symbols and the second number of parity symbols based in part on a Reed-Solomon (RS) (n, k) error-correction code.

Example 11. The apparatus of example 10, wherein the RS error-correction code is based on a Galois Fields (GF) ($2^m$) encoding.

Example 12. The apparatus of any one of examples 1 to 9, wherein the symbols of the symbol stream comprise 8b10b encoded line link (LL) symbols.

Example 13. At least one machine-readable storage medium comprising instructions, that when executed by an interconnect processor, cause the interconnect processor to: receive a high-speed interconnect symbol stream having a plurality of symbols; determine forward-error correction (FEC) parity bits based in part on the plurality of symbols of the symbol stream; and generate a FEC correctable symbol stream based on the plurality of symbols and the FEC parity bits.

Example 14. The at least one machine-readable storage medium of example 13, wherein the high-speed interconnect is a DisplayPort interconnect.

Example 15. The at least one machine-readable storage medium of example 14, comprising instructions, that when executed by the interconnect processor, cause the interconnect processor to: generate a first FEC block and a second FEC block from the plurality of symbols of the symbol stream, the first FEC block comprising a first subset of the plurality of symbols and the second FEC block comprising a second subset, different than the first subset, of the plurality of symbols; and determine the FEC parity bits based in part on the FEC blocks.

Example 16. The at least one machine-readable storage medium of example 15, comprising instructions, that when executed by the interconnect processor, cause the interconnect processor to: determine a first number of parity symbols based in part on the symbols of the first FEC block and to determine a second number of symbols based in part on the symbols of the second FEC block; and determine the FEC parity bits based in part on the first number of parity symbols and the second number of parity symbols.

Example 17. The at least one machine-readable storage medium of example 16, comprising instructions, that when executed by the interconnect processor, cause the interconnect processor to encode the first number of parity symbols and the second number of parity symbols to determine the FEC parity bits.

Example 18. The at least one machine-readable storage medium of example 17, comprising instructions, that when executed by the interconnect processor, cause the interconnect processor to generate an information element to include indication of the plurality of symbols of the symbol stream and the FEC parity bits.

Example 19. The at least one machine-readable storage medium of example 18, comprising instructions, that when executed by the interconnect processor, cause the interconnect processor to interleave the first number of parity symbols and the second number of parity symbols to determine the FEC parity bits.

Example 20. The at least one machine-readable storage medium of example 18, comprising instructions, that when executed by the interconnect processor, cause the interconnect processor to send the information element to a receiver view the high-speed interconnect.

Example 21. The at least one machine-readable storage medium of example 15, the DisplayPort interconnect a dual-link interconnect, the high-speed interconnect symbol stream a first high-speed interconnect symbol stream corresponding to a first link of the dual-link interconnect, the at least one machine-readable storage medium comprising instructions, that when executed by the interconnect processor, cause the interconnect processor to: receive a second high-speed interconnect symbol stream corresponding to a second link of the dual-link interconnect; and generate the first FEC block and the second FEC block from the plurality of symbols of the first symbol stream and the second symbol stream, the first FEC block comprising a first subset of the plurality of symbols of the first symbol stream and the second symbol stream and the second FEC block comprising a second subset, different than the first subset, of the plurality of symbols of the first symbol stream and the second symbol stream.

Example 22. The at least one machine-readable storage medium of any one of examples 16 to 21, comprising instructions, that when executed by the interconnect processor, cause the interconnect processor to generate the first number of parity symbols and the second number of parity symbols based in part on a Reed-Solomon (RS) (n, k) error-correction code. Example 23. The at least one machine-readable storage medium of example 22, wherein the RS error-correction code is based on a Galois Fields (GF) ($2^m$) encoding.

Example 24. The at least one machine-readable storage medium of any one of examples 1 to 21, wherein the symbols of the symbol stream comprise 8b10b encoded line link (LL) symbols.

Example 25. A method comprising: receiving, via a high-speed interconnect, a symbol stream having a plurality of symbols; determining, at an interconnect processor, forward-error correction (FEC) parity bits based in part on the plurality of symbols of the symbol stream; and generating, at the interconnect processor, a FEC correctable symbol stream based on the plurality of symbols and the FEC parity bits.

Example 26. The method of example 25, wherein the high-speed interconnect is a DisplayPort interconnect.

Example 27. The method of example 26, comprising: generating a first FEC block and a second FEC block from the plurality of symbols of the symbol stream, the first FEC block comprising a first subset of the plurality of symbols and the second FEC block comprising a second subset, different than the first subset, of the plurality of symbols; and determining the FEC parity bits based in part on the FEC blocks.

Example 28. The method of example 27, comprising: determining a first number of parity symbols based in part on the symbols of the first FEC block and to determine a second number of symbols based in part on the symbols of the second FEC block; and determining the FEC parity bits based in part on the first number of parity symbols and the second number of parity symbols.

Example 29. The method of example 28, comprising encoding the first number of parity symbols and the second number of parity symbols to determine the FEC parity bits.

Example 30. The method of example 29, comprising generating an information element to include indication of the plurality of symbols of the symbol stream and the FEC parity bits.

Example 31. The method of example 30, comprising interleaving the first number of parity symbols and the second number of parity symbols to determine the FEC parity bits.

Example 32. The method of example 30, comprising sending the information element to a receiver view the high-speed interconnect.

Example 33. The method of example 27, the DisplayPort interconnect a dual-link interconnect, the high-speed interconnect symbol stream a first high-speed interconnect symbol stream corresponding to a first link of the dual-link interconnect, the method comprising: receiving a second high-speed interconnect symbol stream corresponding to a second link of the dual-link interconnect; and generating the first FEC block and the second FEC block from the plurality of symbols of the first symbol stream and the second symbol stream, the first FEC block comprising a first subset of the plurality of symbols of the first symbol stream and the second symbol stream and the second FEC block comprising a second subset, different than the first subset, of the plurality of symbols of the first symbol stream and the second symbol stream.

Example 34. The method of any one of examples 28 to 33, comprising generating the first number of parity symbols and the second number of parity symbols based in part on a Reed-Solomon (RS) (n, k) error-correction code.

Example 35. The method of example 34, wherein the RS error-correction code is based on a Galois Fields (GF) ($2^m$) encoding.

Example 36. The method of any one of examples 25 to 33, wherein the symbols of the symbol stream comprise 8b10b encoded line link (LL) symbols.

Example 37. An apparatus for a device, the apparatus comprising means for performing the method of any one of examples 25 to 36.

The invention claimed is:

1. An apparatus for a transmitter, comprising physical (PHY) layer circuitry arranged to:
    encode link layer symbols based on an 8b10b encoding scheme;
    interleave the symbols corresponding to a symbol stream to form a plurality of interleaved forward error correction (FEC) blocks;
    generate a plurality of Reed Solomon (RS) parity symbols for the plurality of interleaved FEC blocks; and
    generate a FEC symbol stream from the plurality of interleaved FEC blocks and the plurality of RS parity symbols.

2. The apparatus of claim 1, the PHY layer circuitry arranged to:
    interleave a number of even symbols from the FEC symbol stream to form a first FEC block of the plurality of FEC blocks; and
    interleave a number of odd symbols from the FEC symbol stream to form a second FEC block of the plurality of FEC blocks.

3. The apparatus of claim 2, the PHY layer circuitry arranged to:
    interleave the plurality of RS parity symbols generated for the first FEC block with the plurality of RS parity symbols generated for the second FEC block; and
    encode the interleaved plurality of RS parity symbols with the 8b10b encoding scheme.

4. The apparatus of claim 1, the PHY layer circuitry arranged to:
    interleave a number of odd symbols from a first lane of the FEC symbol stream with a number of even symbols from a second lane of the FEC symbol stream to form a first FEC block of the plurality of FEC blocks; and
    interleave the number of even symbols from the first lane of the FEC symbol stream with the number of odd symbols from the second lane of the FEC symbol stream to form a second FEC block of the plurality of FEC blocks.

5. The apparatus of claim 4, the PHY layer circuitry arranged to:
    interleave odd ones of the plurality of RS parity symbols generated for the first FEC block with even ones of the plurality of RS parity symbols generated for the second FEC block to form a first set of RS parity symbols;

interleave even ones of the plurality of RS parity symbols generated for the first FEC block with odd ones of the plurality of RS parity symbols generated for the second FEC block to form a second set of RS parity symbols; and encode the first set of RS parity symbols and the second set of RS parity symbols with the 8b10b encoding scheme.

6. The apparatus of claim 1, wherein the plurality of RS parity symbols are generated based on an RS error-correction code having a Galois Fields (GF) of $2^m$.

7. The apparatus of claim 1, wherein the FEC symbol stream is a DisplayPort compliant symbol stream.

8. The apparatus of claim 7, the PHY layer circuitry arranged to send the FEC symbol stream to a DisplayPort receiver device.

9. An apparatus for a receiver, comprising physical (PHY) layer circuitry arranged to:
receive a forward error correction (FEC) symbol stream, wherein the FEC symbol stream comprises a plurality of FEC blocks and a plurality of Reed-Solomon (RS) parity symbols;
de-interleave the plurality of FEC blocks, based on the plurality of RS parity symbols, to form a symbol stream; and
decode link layer symbols from the symbol stream based on an 8b10b encoding scheme.

10. The apparatus of claim 9, the PHY layer circuitry arranged to:
de-interleave a first one of the plurality of FEC blocks into a number of even symbols of the symbol stream; and
de-interleave a second one of the plurality of FEC blocks into a number of odd symbols of the symbol stream.

11. The apparatus of claim 10, the PHY layer circuitry arranged to:
decode the plurality of RS parity symbols with the 8b10b encoding scheme.

12. The apparatus of claim 9, the PHY layer circuitry arranged to:
de-interleave a first one of the plurality of FEC blocks into a number of odd symbols from a first lane of the symbol stream and a number of even symbols from a second lane of the symbol stream; and
de-interleave a second one of the plurality of FEC blocks into a number of even symbols from the first lane of the symbol stream and a number of odd symbols from the second lane of the symbol stream.

13. The apparatus of claim 9, wherein the plurality of RS parity symbols are generated based on an RS error-correction code having a Galois Fields (GF) of $2^m$.

14. The apparatus of claim 9, wherein the FEC symbol stream is a DisplayPort compliant symbol stream.

15. The apparatus of claim 14, the PHY layer circuitry arranged to receive the FEC symbol stream from a DisplayPort transmitter device.

16. A system comprising:
a symbol stream transmitter, comprising transmitter (Tx) physical (PHY) layer circuitry arranged to:
encode link layer symbols based on an 8b10b encoding scheme,
interleave the symbols corresponding to a symbol stream to form a plurality of interleaved forward error correction (FEC) blocks,
generate a plurality of Reed Solomon (RS) parity symbols for the plurality of interleaved FEC blocks, and
generate a FEC symbol stream from the plurality of interleaved FEC blocks and the plurality of RS parity symbols; and
a symbol stream receiver, comprising receiver (Rx) physical (PHY) layer circuitry arranged to receive the FEC symbol stream from the Tx PHY layer circuitry via a display link.

17. The system of claim 16, the Tx PHY layer circuitry arranged to:
interleave a number of even symbols from the FEC symbol stream to form a first FEC block of the plurality of FEC blocks; and
interleave a number of odd symbols from the FEC symbol stream to form a second FEC block of the plurality of FEC blocks.

18. The system of claim 17, the Tx PHY layer circuitry arranged to:
interleave the plurality of RS parity symbols generated for the first FEC block with the plurality of RS parity symbols generated for the second FEC block; and
encode the interleaved plurality of RS parity symbols with the 8b10b encoding scheme.

19. The system of claim 16, the Tx PHY layer circuitry arranged to:
interleave a number of odd symbols from a first lane of the FEC symbol stream with the number of even symbols from a second lane of the FEC symbol stream to form a first FEC block of the plurality of FEC blocks; and
interleave a number of even symbols from the first lane of the FEC symbol stream with the number of odd symbols from the second lane of the FEC symbol stream to form a second FEC block of the plurality of FEC blocks.

20. The system of claim 19, the Tx PHY layer circuitry arranged to:
interleave odd ones of the plurality of RS parity symbols generated for the first FEC block with even ones of the plurality of RS parity symbols generated for the second FEC block to form a first set of RS parity symbols;
interleave even ones of the plurality of RS parity symbols generated for the first FEC block with odd ones of the plurality of RS parity symbols generated for the second FEC block to form a second set of RS parity symbols; and
encode the first set of RS parity symbols and the second set of RS parity symbols with the 8b10b encoding scheme.

21. The system of claim 16, wherein the plurality of RS parity symbols are generated based on an RS error-correction code having a Galois Fields (GF) of $2^m$.

22. The system of claim 16, wherein the FEC symbol stream is a DisplayPort compliant symbol stream.

23. The system of claim 16, wherein the display link is a DisplayPort compliant link.

24. A method, comprising:
encoding, at physical (PHY) layer circuitry, link layer symbols based on an 8b10b encoding scheme;
interleaving the symbols corresponding to a symbol stream to form a plurality of interleaved forward error correction (FEC) blocks;
generating a plurality of Reed Solomon (RS) parity symbols for the plurality of interleaved FEC blocks; and
generating a FEC symbol stream from the plurality of interleaved FEC blocks and the plurality of RS parity symbols.

25. The method of claim 24, comprising:
- interleaving a number of even symbols from the FEC symbol stream to form a first FEC block of the plurality of FEC blocks; and
- interleaving a number of odd symbols from the FEC symbol stream to form a second FEC block of the plurality of FEC blocks.

26. The method of claim 25, comprising:
- interleaving the plurality of RS parity symbols generated for the first FEC block with the plurality of RS parity symbols generated for the second FEC block; and
- encoding the interleaved plurality of RS parity symbols with the 8b10b encoding scheme.

27. The method of claim 24, comprising:
- interleaving a number of odd symbols from a first lane of the FEC symbol stream with the number of even symbols from a second lane of the FEC symbol stream to form a first FEC block of the plurality of FEC blocks; and
- interleaving a number of even symbols from the first lane of the FEC symbol stream with the number of odd symbols from the second lane of the FEC symbol stream to form a second FEC block of the plurality of FEC blocks.

28. The method of claim 27, comprising:
- interleaving odd ones of the plurality of RS parity symbols generated for the first FEC block with even ones of the plurality of RS parity symbols generated for the second FEC block to form a first set of RS parity symbols;
- interleaving even ones of the plurality of RS parity symbols generated for the first FEC block with odd ones of the plurality of RS parity symbols generated for the second FEC block to form a second set of RS parity symbols; and
- encoding the first set of RS parity symbols and the second set of RS parity symbols with the 8b10b encoding scheme.

29. The method of claim 24, wherein the plurality of RS parity symbols are generated based on an RS error-correction code having a Galois Fields (GF) of $2^m$.

30. The method of claim 24, wherein the FEC symbol stream is a DisplayPort compliant symbol stream.

31. The method of claim 30, comprising sending the FEC symbol stream to a DisplayPort receiver device.

32. At least one non-transitory storage device comprising a plurality of instructions that in response to being executed by a processor of a computing device cause the computing device to:
- encode link layer symbols based on an 8b10b encoding scheme;
- interleave the symbols corresponding to a symbol stream to form a plurality of interleaved forward error correction (FEC) blocks;
- generate a plurality of Reed Solomon (RS) parity symbols for the plurality of interleaved FEC blocks; and
- generate a FEC symbol stream from the plurality of interleaved FEC blocks and the plurality of RS parity symbols.

33. The at least one storage device of claim 32, comprising instructions that in response to be executed by the processor cause the computing device to:
- interleave a number of even symbols from the FEC symbol stream to form a first FEC block of the plurality of FEC blocks; and
- interleave a number of odd symbols from the FEC symbol stream to form a second FEC block of the plurality of FEC blocks.

34. The at least one storage device of claim 33, comprising instructions that in response to be executed by the processor cause the computing device to:
- interleave the plurality of RS parity symbols generated for the first FEC block with the plurality of RS parity symbols generated for the second FEC block; and
- encode the interleaved plurality of RS parity symbols with the 8b10b encoding scheme.

35. The at least one storage device of claim 32, comprising instructions that in response to be executed by the processor cause the computing device to:
- interleave a number of odd symbols from a first lane of the FEC symbol stream with the number of even symbols from a second lane of the FEC symbol stream to form a first FEC block of the plurality of FEC blocks; and
- interleave a number of even symbols from the first lane of the FEC symbol stream with the number of odd symbols from the second lane of the FEC symbol stream to form a second FEC block of the plurality of FEC blocks.

36. The at least one storage device of claim 35, comprising instructions that in response to be executed by the processor cause the computing device to:
- interleave odd ones of the plurality of RS parity symbols generated for the first FEC block with even ones of the plurality of RS parity symbols generated for the second FEC block to form a first set of RS parity symbols;
- interleave even ones of the plurality of RS parity symbols generated for the first FEC block with odd ones of the plurality of RS parity symbols generated for the second FEC block to form a second set of RS parity symbols; and
- encode the first set of RS parity symbols and the second set of RS parity symbols with the 8b10b encoding scheme.

37. The at least one storage device of claim 32, wherein the plurality of RS parity symbols are generated based on an RS error-correction code having a Galois Fields (GF) of $2^m$.

38. The at least one storage device of claim 32, wherein the FEC symbol stream is a DisplayPort compliant symbol stream.

* * * * *